(12) United States Patent
Horne et al.

(10) Patent No.: US 12,165,856 B2
(45) Date of Patent: Dec. 10, 2024

(54) INDUCTIVELY COUPLED PLASMA LIGHT SOURCE

(71) Applicants: Hamamatsu Photonics K.K., Shizuoka (JP); Energetiq Technology, Inc., Wilmington, MA (US)

(72) Inventors: Stephen F. Horne, Medford, MA (US); Kosuke Saito, Hamamatsu (JP); Wolfram Neff, Woburn, MA (US); Robert M. Grzybinski, Gloucester, MA (US); Michael J. Roderick, Everett, MA (US)

(73) Assignees: Hamamatsu Photonics K.K., Shizuoka (JP); Energetiq Technology, Inc, Wilmington, MA (US)

( * ) Notice: Subject to any disclaimer, the term of this patent is extended or adjusted under 35 U.S.C. 154(b) by 44 days.

(21) Appl. No.: 17/676,712

(22) Filed: Feb. 21, 2022

(65) Prior Publication Data

US 2023/0268167 A1    Aug. 24, 2023

(51) Int. Cl.
*H01J 37/32* (2006.01)

(52) U.S. Cl.
CPC .. *H01J 37/32935* (2013.01); *H01J 37/32357* (2013.01); *H01J 37/3244* (2013.01)

(58) Field of Classification Search
CPC ... H05B 41/391; H05B 41/2806; H01J 37/08; H01J 37/3056; H01J 37/3171; H01J 37/3244; H01J 37/32357; H01J 37/32935; H05G 2/001; H05G 2/005
See application file for complete search history.

(56) References Cited

U.S. PATENT DOCUMENTS

| | | | |
|---|---|---|---|
| 3,054,921 A | 9/1962 | Lye |
| 3,227,923 A | 1/1966 | Marrison |
| 3,418,507 A | 12/1968 | Young |
| 3,427,564 A | 2/1969 | Okaya |
| 3,495,118 A | 2/1970 | Richter |
| 3,502,929 A | 3/1970 | Richter |
| 3,582,822 A | 6/1971 | Kamey |

(Continued)

FOREIGN PATENT DOCUMENTS

| | | |
|---|---|---|
| DE | 19910725 A1 | 10/1999 |
| DE | 102011113681 A1 | 3/2013 |

(Continued)

OTHER PUBLICATIONS

US 8,471,227 B2, 06/2013, Kakizaki (withdrawn)

(Continued)

*Primary Examiner* — Tung X Le
(74) *Attorney, Agent, or Firm* — Rauschenbach Patent Law Group, PLLC; Kurt Rauschenbach

(57) ABSTRACT

A plasma chamber for a UV light source includes a plasma generation region that defines a plasma confinement region. A port is positioned adjacent to a side of the plasma generation region that allows generated light to pass out of the chamber. A high voltage region is coupled to the plasma generation region. A grounded region is coupled to the high voltage region that defines an outer surface configured to be coupled to the ground and is dimensioned for receiving a surrounding inductive core. A width of the high voltage region is greater than the width of the grounded region.

32 Claims, 8 Drawing Sheets

(56) References Cited

U.S. PATENT DOCUMENTS

| | | |
|---|---|---|
| 3,619,588 A | 11/1971 | Chambers |
| 3,636,395 A | 1/1972 | Banes, Jr. |
| 3,641,389 A | 2/1972 | Leidigh |
| 3,657,588 A | 4/1972 | McRae |
| 3,731,133 A | 5/1973 | McRae |
| 3,764,466 A | 10/1973 | Dawson |
| 3,808,496 A | 4/1974 | McRae |
| 3,826,996 A | 7/1974 | Jaegle et al. |
| 3,900,803 A | 8/1975 | Silfvast et al. |
| 3,911,318 A | 10/1975 | Spero |
| 3,949,258 A | 4/1976 | Soodak |
| 3,982,201 A | 9/1976 | Rosenkrantz et al. |
| 4,054,812 A | 10/1977 | Lessner |
| 4,063,803 A | 12/1977 | Wright |
| 4,088,966 A | 5/1978 | Samis |
| 4,152,625 A | 5/1979 | Conrad |
| 4,177,435 A | 12/1979 | Brown |
| 4,179,037 A | 12/1979 | Chan |
| 4,179,566 A | 12/1979 | Nadelson |
| 4,263,095 A | 4/1981 | Thode |
| 4,272,681 A | 6/1981 | Fill |
| 4,485,333 A | 11/1984 | Goldbert |
| 4,498,029 A | 2/1985 | Yoshizawa et al. |
| 4,536,640 A | 8/1985 | Vukanovic |
| 4,599,540 A | 7/1986 | Roberts |
| 4,633,128 A | 12/1986 | Roberts |
| 4,646,215 A | 2/1987 | Levin et al. |
| 4,702,716 A | 10/1987 | Roberts |
| 4,724,352 A | 2/1988 | Schuda |
| RE32,626 E | 3/1988 | Yoshizawa et al. |
| 4,780,608 A | 10/1988 | Cross et al. |
| 4,785,216 A | 11/1988 | Roberts |
| 4,789,788 A | 12/1988 | Cox |
| 4,866,517 A | 9/1989 | Mohizuki |
| 4,868,458 A | 9/1989 | Davenport et al. |
| 4,872,189 A | 10/1989 | Frankel |
| 4,889,605 A | 12/1989 | Asmus |
| 4,901,330 A | 2/1990 | Wolfram et al. |
| 4,978,893 A | 12/1990 | Brannon |
| 5,052,780 A | 10/1991 | Klein |
| 5,153,673 A | 10/1992 | Amirav |
| 5,299,279 A | 3/1994 | Roberts |
| 5,317,618 A | 5/1994 | Nakahara |
| 5,334,913 A | 8/1994 | Ury et al. |
| 5,359,621 A | 10/1994 | Tsunoda |
| 5,418,420 A | 5/1995 | Roberts |
| 5,442,184 A | 8/1995 | Palmer et al. |
| 5,506,857 A | 4/1996 | Meinzer |
| 5,508,934 A | 4/1996 | Moslehi |
| 5,561,338 A | 10/1996 | Roberts |
| 5,672,931 A | 9/1997 | Kiss |
| 5,686,996 A | 11/1997 | Fidler et al. |
| 5,789,863 A | 8/1998 | Takahashi |
| 5,790,575 A | 8/1998 | Zamel et al. |
| 5,801,495 A | 9/1998 | Smolka et al. |
| 5,825,035 A * | 10/1998 | Mizumura .......... H01J 37/3056 315/111.41 |
| 5,903,088 A | 5/1999 | Sugitani |
| 5,905,268 A | 5/1999 | Garcia |
| 5,940,182 A | 8/1999 | Lepper |
| 6,005,332 A | 12/1999 | Mercer |
| 6,025,916 A | 2/2000 | Quick |
| 6,061,379 A | 5/2000 | Schoen |
| 6,074,516 A | 6/2000 | Howald |
| 6,108,091 A | 8/2000 | Pecen |
| 6,129,807 A | 10/2000 | Grimbergen |
| 6,181,053 B1 | 1/2001 | Roberts |
| 6,184,517 B1 | 2/2001 | Sawada et al. |
| 6,200,005 B1 | 3/2001 | Roberts |
| 6,212,989 B1 | 4/2001 | Beyer |
| 6,236,147 B1 | 5/2001 | Manning |
| 6,265,813 B1 | 7/2001 | Knox |
| 6,274,970 B1 | 8/2001 | Capobianco |
| 6,275,565 B1 | 8/2001 | Tomie |
| 6,281,629 B1 | 8/2001 | Tanaka |
| 6,285,131 B1 | 9/2001 | Kiss |
| 6,288,780 B1 | 9/2001 | Fairley et al. |
| 6,316,867 B1 | 11/2001 | Roberts |
| 6,331,993 B1 | 12/2001 | Brown |
| 6,339,279 B1 | 1/2002 | Miyamoto |
| 6,339,280 B1 | 1/2002 | Miyamoto |
| 6,351,058 B1 | 2/2002 | Roberts |
| 6,374,012 B1 | 4/2002 | Bergmann et al. |
| 6,400,067 B1 | 6/2002 | Manning |
| 6,400,089 B1 | 6/2002 | Salvermoser |
| 6,414,436 B1 | 7/2002 | Eastlund |
| 6,417,625 B1 | 7/2002 | Brooks et al. |
| 6,445,134 B1 | 9/2002 | Asmus |
| 6,493,364 B1 | 12/2002 | Baumler et al. |
| 6,504,319 B2 | 1/2003 | Herter |
| 6,504,903 B1 | 1/2003 | Kondo |
| 6,532,100 B1 | 3/2003 | Partanen |
| 6,541,924 B1 | 4/2003 | Kane et al. |
| 6,597,087 B2 | 7/2003 | Roberts |
| 6,602,104 B1 | 8/2003 | Roberts |
| 6,670,758 B2 | 12/2003 | Beech |
| 6,737,809 B2 | 5/2004 | Espiau |
| 6,762,849 B1 | 7/2004 | Rulkens |
| 6,768,264 B2 | 7/2004 | Beech |
| 6,788,404 B2 | 9/2004 | Lange |
| 6,816,323 B2 | 11/2004 | Colin et al. |
| 6,821,377 B2 | 11/2004 | Saito |
| 6,834,984 B2 | 12/2004 | Tausch |
| 6,865,255 B2 | 3/2005 | Richardson |
| 6,867,419 B2 | 3/2005 | Tajima |
| 6,914,919 B2 | 7/2005 | Watson |
| 6,956,329 B2 | 10/2005 | Brooks et al. |
| 6,956,885 B2 | 10/2005 | Taylor |
| 6,970,492 B2 | 11/2005 | Govorkov |
| 6,972,421 B2 | 12/2005 | Melnychuk et al. |
| 7,050,149 B2 | 5/2006 | Owa et al. |
| 7,072,367 B2 | 7/2006 | Arisawa |
| 7,087,914 B2 | 8/2006 | Akins et al. |
| 7,158,221 B2 | 1/2007 | Davis |
| 7,164,144 B2 | 1/2007 | Partlo et al. |
| 7,176,633 B1 | 2/2007 | Roberts |
| 7,274,435 B2 | 9/2007 | Hiura |
| 7,307,375 B2 | 12/2007 | Smith et al. |
| 7,368,741 B2 | 5/2008 | Melnychuk |
| 7,399,981 B2 | 7/2008 | Cheymol et al. |
| 7,427,167 B2 | 9/2008 | Holder et al. |
| 7,429,818 B2 | 9/2008 | Chang et al. |
| 7,435,982 B2 | 10/2008 | Smith |
| 7,439,497 B2 | 10/2008 | Dantus |
| 7,439,530 B2 | 10/2008 | Ershov |
| 7,456,417 B2 | 11/2008 | Murakami et al. |
| 7,567,607 B2 | 7/2009 | Knowles et al. |
| 7,598,509 B2 | 10/2009 | Ershov |
| 7,632,419 B1 | 12/2009 | Grimgergen |
| 7,652,430 B1 | 1/2010 | Delgado |
| 7,671,349 B2 | 3/2010 | Bykanov |
| 7,679,027 B2 | 3/2010 | Bogatu |
| 7,679,276 B2 | 3/2010 | Blondia |
| 7,680,158 B2 | 3/2010 | Endo |
| 7,705,331 B1 | 4/2010 | Kirk et al. |
| 7,773,656 B1 | 8/2010 | Mills |
| 7,786,455 B2 | 8/2010 | Smith |
| 7,795,816 B2 | 9/2010 | Jennings |
| 8,003,963 B2 | 8/2011 | Ngai et al. |
| 8,148,900 B1 | 4/2012 | Kirk et al. |
| 8,242,671 B2 | 8/2012 | Blondia |
| 8,242,695 B2 | 8/2012 | Sumitomo |
| 8,253,926 B2 | 8/2012 | Sumitomo |
| 8,309,943 B2 | 11/2012 | Smith |
| 8,320,424 B2 | 11/2012 | Bolt |
| 8,427,067 B2 | 4/2013 | Espiau |
| 8,525,138 B2 | 9/2013 | Smith et al. |
| 8,710,475 B2 | 4/2014 | Komori et al. |
| 8,969,841 B2 | 3/2015 | Smith |
| 9,048,000 B2 | 6/2015 | Smith |
| 9,185,786 B2 | 11/2015 | Smith |
| 9,576,785 B2 | 2/2017 | Blondia |
| 9,609,732 B2 | 3/2017 | Smith |
| 9,678,262 B2 | 6/2017 | Görtz et al. |

(56) References Cited

U.S. PATENT DOCUMENTS

| | | |
|---|---|---|
| 9,741,553 B2 | 8/2017 | Blondia |
| 9,748,086 B2 | 8/2017 | Blondia |
| 9,922,814 B2 | 3/2018 | Blondia |
| 10,006,865 B1 | 6/2018 | Shaughnessy et al. |
| 10,008,378 B2 | 6/2018 | Blondia |
| 10,057,973 B2 | 8/2018 | Blondia |
| 10,078,167 B2 | 9/2018 | Brune et al. |
| 10,109,473 B1 | 10/2018 | Blondia et al. |
| 10,186,414 B2 | 1/2019 | Blondia |
| 10,186,416 B2 | 1/2019 | Blondia |
| 10,203,247 B2 | 2/2019 | Brady et al. |
| 10,217,625 B2 | 2/2019 | Bezel et al. |
| 10,222,701 B2 | 3/2019 | Zhao et al. |
| 10,770,282 B1 | 9/2020 | Abramenko et al. |
| 2001/0035720 A1 | 11/2001 | Guthrie |
| 2002/0021508 A1 | 2/2002 | Ishihara |
| 2002/0036820 A1 | 3/2002 | Merriam |
| 2002/0044624 A1 | 4/2002 | Davis et al. |
| 2002/0044629 A1 | 4/2002 | Hertz et al. |
| 2002/0080834 A1 | 6/2002 | Kusunose |
| 2002/0172235 A1 | 11/2002 | Chang et al. |
| 2003/0006383 A1 | 1/2003 | Melnychuk |
| 2003/0034736 A1 | 2/2003 | Eastlund |
| 2003/0052609 A1 | 3/2003 | Eastlund et al. |
| 2003/0068012 A1* | 4/2003 | Ahmad .................. H05G 2/005 378/119 |
| 2003/0086139 A1 | 5/2003 | Wing So |
| 2003/0090902 A1 | 5/2003 | Kavanaugh |
| 2003/0147499 A1 | 8/2003 | Kondo |
| 2003/0168982 A1 | 9/2003 | Kim |
| 2003/0193281 A1 | 10/2003 | Manning |
| 2003/0231496 A1 | 12/2003 | Sato et al. |
| 2004/0008433 A1 | 1/2004 | Margeson |
| 2004/0016894 A1 | 1/2004 | Wester |
| 2004/0018647 A1 | 1/2004 | Jones |
| 2004/0084406 A1 | 5/2004 | Kamp |
| 2004/0108473 A1 | 6/2004 | Melnychuk |
| 2004/0129896 A1 | 7/2004 | Schmidt et al. |
| 2004/0134426 A1 | 7/2004 | Tomoyasu |
| 2004/0183031 A1 | 9/2004 | Silverman |
| 2004/0183038 A1 | 9/2004 | Hiramoto et al. |
| 2004/0026512 A1 | 12/2004 | Otsubo |
| 2004/0238762 A1 | 12/2004 | Mizoguchi et al. |
| 2004/0239894 A1 | 12/2004 | Shimada |
| 2004/0264512 A1 | 12/2004 | Hartlove et al. |
| 2005/0057158 A1 | 3/2005 | Chang et al. |
| 2005/0167618 A1 | 8/2005 | Hoshino et al. |
| 2005/0168148 A1 | 8/2005 | Allen |
| 2005/0199829 A1 | 9/2005 | Partlo et al. |
| 2005/0205803 A1 | 9/2005 | Mizoguchi |
| 2005/0205811 A1 | 9/2005 | Partlo et al. |
| 2005/0207454 A1 | 9/2005 | Starodoumov |
| 2005/0225739 A1 | 10/2005 | Hiura |
| 2005/0243390 A1 | 11/2005 | Tejnil |
| 2005/0276285 A1 | 12/2005 | Huang et al. |
| 2006/0039435 A1 | 2/2006 | Cheymol et al. |
| 2006/0078017 A1 | 4/2006 | Endo et al. |
| 2006/0103952 A1 | 5/2006 | Gouch |
| 2006/0131515 A1 | 6/2006 | Partlo et al. |
| 2006/0152128 A1 | 7/2006 | Manning |
| 2006/0176925 A1 | 8/2006 | Nakano |
| 2006/0186356 A1 | 8/2006 | Iami et al. |
| 2006/0192152 A1 | 8/2006 | Ershov et al. |
| 2006/0202625 A1 | 9/2006 | Song |
| 2006/0215712 A1 | 9/2006 | Ziener |
| 2006/0219957 A1 | 10/2006 | Ershov et al. |
| 2006/0255298 A1 | 11/2006 | Bykanov |
| 2007/0001131 A1 | 1/2007 | Ershov |
| 2007/0228288 A1 | 10/2007 | Smith |
| 2007/0228300 A1 | 10/2007 | Smith |
| 2007/0285921 A1 | 12/2007 | Zulim et al. |
| 2008/0048133 A1 | 2/2008 | Bykanov |
| 2008/0055712 A1 | 3/2008 | Noelscher |
| 2008/0059096 A1 | 3/2008 | Stenstrom |
| 2008/0237496 A1* | 10/2008 | Gupta .................... H01J 37/08 250/492.21 |
| 2009/0032740 A1 | 2/2009 | Smith et al. |
| 2009/0196801 A1 | 8/2009 | Mills |
| 2009/0267003 A1 | 10/2009 | Moriya |
| 2009/0314967 A1 | 12/2009 | Moriya |
| 2010/0164380 A1 | 7/2010 | Sumitomo |
| 2010/0181503 A1 | 7/2010 | Yanagida |
| 2010/0253935 A1 | 10/2010 | Mackinnon et al. |
| 2010/0264820 A1 | 10/2010 | Sumitomo |
| 2011/0181191 A1 | 7/2011 | Smith et al. |
| 2011/0204265 A1 | 8/2011 | Smith et al. |
| 2011/0291566 A1 | 12/2011 | Bezel |
| 2013/0062538 A1* | 3/2013 | Kodama ................ H05G 2/006 250/504 R |
| 2013/0234597 A1* | 9/2013 | Kusunose ........... G03F 7/70916 313/356 |
| 2013/0342105 A1* | 12/2013 | Shchemelinin ........ H01J 61/28 315/111.21 |
| 2014/0117258 A1 | 5/2014 | Smith |
| 2015/0021500 A1 | 1/2015 | Smith |
| 2015/0289353 A1 | 10/2015 | Smith |
| 2016/0057845 A1 | 2/2016 | Smith |
| 2016/0093463 A1* | 3/2016 | Bhattacharjee ......... H01J 37/05 315/111.31 |
| 2017/0135192 A1 | 5/2017 | Blondia |
| 2017/0150590 A1 | 5/2017 | Chimmalgi et al. |
| 2019/0037676 A1 | 1/2019 | Khodykin et al. |
| 2019/0045615 A1 | 2/2019 | Mori et al. |
| 2019/0053364 A1 | 2/2019 | Mori et al. |
| 2019/0075641 A1 | 3/2019 | Kuritsyn et al. |
| 2019/0021158 A1 | 7/2019 | Nozaki |
| 2020/0012165 A1 | 1/2020 | Haller |
| 2020/0393687 A1 | 12/2020 | Yabu et al. |
| 2021/0120659 A1 | 4/2021 | Szilagyi et al. |
| 2022/0229307 A1 | 7/2022 | Wang et al. |
| 2022/0375740 A1 | 11/2022 | Partlow et al. |

FOREIGN PATENT DOCUMENTS

| | | |
|---|---|---|
| EP | 1083777 A9 | 3/2001 |
| EP | 2534672 B1 | 6/2016 |
| FR | 1471215 A | 3/1967 |
| FR | 2554302 A1 | 5/1985 |
| GB | 2266406 A | 10/1993 |
| JP | 53-103395 A | 9/1978 |
| JP | 61-193358 A | 8/1986 |
| JP | 1-296560 A | 11/1989 |
| JP | 4-144053 A | 5/1992 |
| JP | 5-82087 A | 4/1993 |
| JP | H05-82087 B2 | 11/1993 |
| JP | 8-299951 A | 11/1996 |
| JP | 9-288995 A | 11/1997 |
| JP | 2003-317675 A | 11/2003 |
| JP | 2004-134166 A | 4/2004 |
| JP | 2006-010675 A | 1/2006 |
| JP | 2006-080255 A | 3/2006 |
| JP | 4255662 B2 | 4/2009 |
| JP | 2010-087388 A | 4/2010 |
| JP | 2010-171159 A | 8/2010 |
| JP | 6243845 B2 | 12/2017 |
| KR | 2001-0062437 A | 7/2001 |
| KR | 10-2005-0003392 A | 1/2005 |
| KR | 10-2006-0064319 A | 6/2006 |
| KR | 10-2006-0087004 A | 8/2006 |
| KR | 10-2008-0108111 A | 12/2008 |
| KR | 10-2010-0114455 A | 10/2010 |
| KR | 10-2016-0071231 A | 6/2016 |
| KR | 10-1639963 B1 | 7/2016 |
| NL | 8403294 A | 6/1985 |
| RU | 2266628 C2 | 12/2005 |
| RU | 2278483 C2 | 6/2006 |
| RU | 2326463 C2 | 6/2008 |
| RU | 2780202 C1 | 9/2022 |
| WO | 94/10729 A1 | 5/1994 |
| WO | 98/11388 A1 | 3/1998 |
| WO | 98/54611 A2 | 12/1998 |
| WO | 99/18594 A1 | 4/1999 |

(56) References Cited

FOREIGN PATENT DOCUMENTS

| WO | 02/087291 A2 | 10/2002 |
|---|---|---|
| WO | 03/079391 A2 | 9/2003 |
| WO | 2004/023061 A2 | 3/2004 |
| WO | 2004/084592 A2 | 9/2004 |
| WO | 2004/097520 A2 | 11/2004 |
| WO | 2005/004555 A2 | 1/2005 |
| WO | 2007/002170 A2 | 1/2007 |
| WO | 2010/093903 A2 | 8/2010 |
| WO | 2018/136683 A1 | 7/2018 |
| WO | 2019/023150 A1 | 1/2019 |
| WO | 2019/023303 A1 | 1/2019 |
| WO | 2022/159352 A1 | 7/2022 |
| WO | 2022/251000 A1 | 12/2022 |

OTHER PUBLICATIONS

International Search Report and Written Opinion received for PCT Application No. PCT/US2023/061198, mailed on May 30, 2023, 14 pages.
Schohl et al., "Absolute Detection of Metastable Rare Gas Atoms by a CW Laser Photoionization Method", Z. Phys. D—Atoms, Molecules and Clusters, vol. 21, 1991, pp. 25-39.
Yamanaka, "Inertial Confinement Fusion Research at ILE Osaka", Nuclear Fusion, vol. 25, No. 9, 1985, pp. 1343-1349.
Shaw et al., "Preliminary Design of Laser-Induced Breakdown Spectroscopy for Proto-Material Plasma Exposure Experiment", Review Of Scientific Instruments, vol. 85, 2014, pp. 11D806-1-11D806-3.
Shen et al., "Highly Efficient Er, Yb-Doped Fiber Laser with 188W Free-Running and >100W Tunable Output Power", Optics Express, vol. 13, No. 13, 2005, pp. 4916-4921.
Shigeyoshi et al., "Near Infrared Absorptions of Neon, Argon, Krypton, and Xenon Excited Diatomic Molecules", J. Chem. Phys., vol. 68, 1978, pp. 7595-4603.
Shimada et al., "Characterization of Extreme Ultraviolet Emission from Laser-Produced Spherical Tin Plasm Generated with Multiple Laser Beams", Applied Physics Letters, vol. 86, 2005, pp. 051501-1-051501-3.
Shirakawa et al., "CW 7-W, 900-nm-wide Supercontinuum Source by Phosphosilicate Fiber Raman Laser and Highnonlinear Fiber", Proceedings of SPIE, vol. 5709, 2005, pp. 199-205.
Sidawi, "Fiber Lasers Gain Power", www.rdmag.com, 2003, p. 26.
Silfvast et al., "Comparison of Radiation from Laser-Produced and DC-Heated Plasmas in Xenon", Applied Physics Letters, vol. 25, No. 5, 1974, pp. 274-277.
Silfvast, Laser Fundamentals, Schhol of Optics, 2004, pp. 1-6, pp. 199-222 & 565-568.
Skenderovic et al., "Laser-ignited glow discharge in lithium vapor", Physical Review A, vol. 62, 2000, pp. 052707-1-052707-7.
Smith, "Gas-Breakdown Dependence on Beam Size and Pulse Duration with 10.6-µ Wavelength Radiation", Applied Physics Letters, vol. 19, No. 10, 1971, pp. 405-408.
Snyder et al., "Laser-Induced Breakdown Spectroscopy of High-Pressure Bulk Aqueous Solutions", Applied Spectroscopy, vol. 60, No. 7, 2006, pp. 786-790.
Sobota et al., "The Role of Metastables in the Formation of an Argon Discharge in a Two-Pin Geometry", IEEE Transactions on Plasma Science, vol. 38, No. 9, 2010, pp. 2289-2299.
Song et al., "Mechanisms of Absorption in Pulsed Excimer Laser-Induced Plasma", Appl. Phys. A, vol. 65, 1997, pp. 477-485.
Stamm, "Extreme Ultraviolet Light Sources for use in Semiconductor Lithography—State of the Art and Future Development", J. Phys. D: Appl. Phys., vol. 37, 2004, pp. 3244-3253.
Stulen et al., "Developing A Soft X-Ray Projection Lithography Tool", AT & T Technical Journal, 1991, pp. 37-48.
Su et al., "Note: A Transient Absorption Spectrometer Using an Ultra Bright Laser-Driven Light Source", Review Of Scientific Instruments, vol. 84, 2013, pp. 086106-1-386106-3.

Sundvold et al., "Optical Firing System", Proc. Of SPIE, vol. 5871, 2005, pp. 587104-1-587104-10.
Super-Quiet Xenon Lamp Super-Quiet Mercury-Xenon Lamp, Hamamatsu Product Information, Nov. 2005, 16 pages.
Surzhikov, "Numerical Simulation of Subsonic Gasdynamical Instabilities Near Heat Release Regions", AIAA, 1996, pp. 1-11.
Yamakoshi et al., "Extreme-Ultraviolet Laser Photo-Pumped by a Self-Healing Hg Target",SPIE, Vo . . . 2015, 1994, pp. 227-231.
Szymanski et al., "Nonstationary Laser-Sustained Plasma", Journal of Applied Physics, vol. 69, No. 6, 1990, pp. 3480-3484.
Szymanski et al., "Spectroscopic Study of a Supersonic Jet of Laser-Heated Argon Plasma", J. Phys. D: Appl. Phys., vol. 30, 1997, pp. 998-1006.
Takahashi et al., "Numerical Analysis of Ar(2) Excimer Production in Laser-Produced Plasmas", Journal of Applied Physics, 1998, pp. 390-393.
Takahashi et al.,"Ar(2) Excimer Emission from a Laser-Heated Plasma in a High-Pressure Argon Gas", Applied Physics Letters, vol. 77, No. 5, 2000, pp. 4115-4117.
Tam et al., "Plasma Production In a Cs Vapor by a Weak cw Laser Beam at 6010 A, Optics Communications", vol. 21, No. 3, 1977, pp. 403-407.
Tam, "Dynamic Response of a cw Laser-produced Cs Plasma to Laser Modulations", Appl. Phys. Lett., vol. 35, No. 9, 1979, pp. 683-685.
Tam, "Quasiresonant Laser-Produced Plasma: An Efficient Mechanism for Localized Breakdown", J. Appl. Phys., vol. 51, No. 9, 1980, pp. 4682-4687.
Tanaka et al., "Production of Laser-Heated Plasma in High-Pressure Ar Gas and Emission Characteristics of Vacuum Ultraviolet Radiation from Ar(2) Excimers", Appl. Phys. B, vol. 74, 2002, pp. 323-326.
Tansu, "Novel Quantum-Wells GaAs-Based Lasers for All Transmission Windows in Optical Communication", 2003, pp. i-291.
Theriault et al., "A Real-Time Fiber-Optic LIBS Probe for the In Situ Delineation of Metals in Soils", Field Analytical Chemistry and Technology, vol. 2, No. 2, 1998, pp. 117-125.
Theriault et al., "Field Deployment of a LIBS Probe for Rapid Delineation of Metals in Soils", SPIE, vol. 2835, 1996, pp. 83-88.
Thermoelectric Cooler Controller, Analog Devices Inc., 2002, pp. 1-24.
Tichenor et al., "Soft-x-ray projection lithography experiments using Schwarzschild imaging optics", Applied Optics, vol. 32, No. 34, 1993, pp. 7068-7071.
Tombelaine, et al. "Spectrally Shaped Light From Supercontinuum Fiber Light Sources", Optics Communications, vol. 284, Issue 7, Apr. 1, 2011, pp. 1970-1974.
Tooman, "The Sandia Laser Plasma Extreme Ultraviolet and Soft X-ray (XUV) Light Source", SPIE vol. 664, 1986, pp. 186-191.
Topanga Advanced Plasma Lighting APL1000-4000SF, p. 1.
Topanga Advanced Plasma Lighting APL1000-5000SF, p. 1.
Topanga Advanced Plasma Lighting APL250-4000BF, p. 1.
Topanga Advanced Plasma Lighting APL250-4000SF, p. 1.
Topanga Advanced Plasma Lighting APL250-5500SF, p. 1.
Topanga Advanced Plasma Lighting APL400-4000BF, p. 1.
Topanga Advanced Plasma Lighting APL400-4000SF, p. 1.
Topanga Advanced Plasma Lighting APL400-5500BF, p. 1.
Topanga Advanced Plasma Lighting APL400-5500SF, p. 1.
Topanga's Advanced Plasma Lighting System, Topanga USA, 2016, pp. 1-5.
Treshchalov et al., "Spectroscopic Diagnostics of Pulsed Discharge in High-Pressure Argon", Quantum Electrics, vol. 40, No. 3, 2010, pp. 234-240.
Tsuboi et al., "Nanosecond Imaging Study on Laser Ablation of Liquid Benzene", Appl. Phys. Lett, vol. 64, 1994, pp. 2745-2747.
Uhlenbusch, et al., "HB-Line Profile Measurements in Optical Discharges", J. Quant. Spectrosc. Radiat. Transfer vol. 44, No. 1, 1990, pp. 47-56.
Hanselman, "Laser-Light Thomson and Rayleigh Scattering in Atmospheric-Pressure Laboratory Plasmas", 1993, Department of Chemistry, pp. ii-385.
Hansson et al., "Liquid-Xenon-Jet Laser-Plasma Source for EUV Lithography", SPIE, vol. 4506, 2001, pp. 1-8.

(56) References Cited

OTHER PUBLICATIONS

Hansson, "Laser-Plasma Sources For Extreme-Ultraviolet Chaps. 5 & 6", 2003, pp. 1-58.
Harris, "A Century of Sapphire Crystal Growth Proceedings", Proceedings of the 10th DoD Electromagnetic Windows Symposium Norfolk, 2004, pp. 1-56.
Harris, "Review Of Navy Program To Develop Optical Quality Diamond Windows And Domes", Naval Air Systems Command, 2002, pp. 1-16.
Harrison et al., "Low-threshold, cw, All-solid-state Ti:Al2O3 Laser", Optics Letter, vol. 16, No. 8, 1991, pp. 581-583.
Hawke et al., "An Apparatus for High Pressure Raman Spectroscopy", Rev. Sci. Instrum., vol. 45, No. 12, 1974, pp. 1598-1601.
Haysom, "Quantum Well Intermixing of InGaAs(P)/InP Heterostructures", Department of Physics, 2001, pp. ii-224.
Hebner et al., "Measured Pressure Broadening and Shift Rates of the 1.73 μm (5d[3/2]1-6p[5/2]2) Transition of Xenon", Applied Physics Letters, vol. 59, No. 9, 1991, pp. 537-539.
Hecht "Fiber Lasers: Fiber Lasers: The state of the art, Laser Focus World", 2012, pp. 1-11.
Hecht "Refraction", Optics (Third Edition), Chapter 4, 1998, pp. 100-101.
High Power Diode Laser, Rofin-Sinar Technologies, Inc., 2000, pp. 1-26.
Horn et al., "Evaluation and Design of a Solid-State 193 nm OPO-Nd:YAG Laser Ablation System", Spectroch mica Acta Part B, vol. 58, 2003, pp. 1837-1846.
Hou et al., "Fiber Laser For EUV Generation", EUV Source Workshop, 2006.
Hou et al., "High Intensity Fiber Lasers: Emerging New Applications and New Fiber Technologies", IEEE LEOS Newsletter, 2007, pp. 22-25.
Hou et al., "High Power Fiber Laser Driver for Efficient EUV Lithography Source with Tin-Doped Water Droplet Targets", Optics Expres,, vol. 16, No. 2, 2008, pp. 965-974.
Hu et al., "Laser Induced Stabilisation of the Welding Arc", 2005, Science and Technology of Welding and Joining, vol. 10, No. 1, pp. 76-81.
Huffman et al., "Absorption Coefficients of Xenon and Argon in the 600-1025 Angstrom Wavelength Regions", The Journal of Chemical Physocs, vol. 39, 1963, pp. 902-909.
Hughes, "Plasmas And Laser Light", University of Essex, 1975, pp. 200-272.
I.M. Beterov et al. "Resonance radiation plasma (photoresonance plasma)", Soy. Phys. Usp. vol. 31, No. 66,1988, pp. 535-554.
Instruction Manual: LDC-3722 Laser Diode Controller, ILX Lightwave Corporation, 1990, pp. 1-1-4-33.
Generalov et al., "Continuous Optical Discharge," ZhETF Pis. Red. 11, No. 9, May 5, 1970, pp. 302-304.
Jin et al., New Laser Plasma Source for Extreme-Ultraviolet, 1995, pp. 2256-2258.
Jahier et al., "Implementation of a Sapphire Cell with External Electrodes for Laser Excitation of a Forbidden Atomic Transition in a Pulsed E-Field", Eur. Phys. J.D., vol. 13, 2001, pp. 221-229.
Jansson et al., "Liquid-Tin-Jet Laser-Plasma Extreme Ultraviolet Generation", Applied Physics Letters, vol. 84, No. 13, 2004, pp. 2256-2258.
Jaroszynski et al., "Radiation Sources Based on Laser-Plasma Interactions", Phil. Trans. R. Soc. vol. 364,2006, pp. 689-710.
Jauregui et al., "High-power Fibre Lasers", Nature Photonics, vol. 7, 2013, pp. 861-867.
Jeng et al., "Theoretical Investigation of Laser-Sustained Argon Plasmas," J. Appl. Phys., vol. 60, No. 7, Oct. 1, 1986, pp. 2272-2279.
Jinno et al., "Luminance and efficacy improvement of low-pressure xenon pulsed fluorescent lamps by using an auxiliary external electrode", J. Phys. D: Appl. Phys., vol. 40, 2007, pp. 3889-3895.
Jinno et al., "The Afterglow Characteristics of Xenon Pulsed Plasma for Mercury-Free Fluorescent Lamps", Czech. J. Phys., vol. 50, 2000, pp. 433-436.

Johnson, "Ultraviolet Emission Spectra of High-Pressure Rare Gases", 1970, Journal Of The Optical Society Of America,, vol. 60, No. 12, pp. 1669-1674.
Joshi et al., "Laser-Induced Breakdown Spectroscopy for In-Cylinder Equivalence Ratio Measurements in Laser-Ignited Natural Gas Engines", Applied Spectroscopy, vol. 63, No. 5, 2009, pp. 549-554.
Kaku et al., "Vacuum Ultraviolet Spectroscopic System Using a Laser-Produced Plasma", Journal of Applied Physics, vol. 42, 2003, pp. 3458-3462.
Kaku et al., "Vacuum Ultraviolet Transmission Spectroscopic System using a Laser-Produced Plasma", The Japan Society of Applied Physics, vol. 42, No. 6R, pp. 149-152.
Keefer et al., "Experimental Study of a Stationary Laser-Sustained Air Plasma," Journal of Applied Physics, vol. 46, No. 3, Mar. 1975, pp. 1080-1083.
Keefer et al., "Power Absorption Laser Sustained Argon Plasmas", AIAA Journal, vol. 24, No. 10, 1986, pp. 1663-1669.
Keefer, "Laser-Sustained Plasmas", 1989, pp. 169-206.
Kennedy et al., "A Review of the Use of High Power Diode Lasers in Surface Hardening, Journal of Materials Processing Technology", vol. 155-156, 2004, pp. 1855-1860.
Keyser et al. "Studies of High-Repetition-Rate Laser Plasma EUV Sources from Droplet Targets", Applied Physics A, vol. 77, 2003, pp. 217-221.
Kim et al., "Development of an In Situ Raman Spectroscopic System for Surface Oxide Films on Metals and Alloys in High Temperature Water, Nuclear Engineering and Design", vol. 235, 2005, pp. 1029-1040.
Kindel et al., Measurement of Excited States Density and the VUV-Radiation in the Pulsed Xenon Medium Pressure Discharge, Contrib. Plasma Phys., vol. 36, 1996, pp. 711-721.
Kirk et al., "Methods and Systems for Providing Illumination of a Specimen for Inspection" U.S. Appl. No. 60/806,204, filed Jun. 29, 2006, 48 pages.
Kirk et al., "Methods and Systems for Providing Illumination of a Specimen for Inspection", U.S. Appl. No. 60/759,846, filed Jan. 17, 2006, 18 pages.
Kirk et al., "Methods and Systems for Providing Illumination of a Specimen for Inspection", U.S. Appl. No. 60/772,425, filed Feb. 9, 2006, 20 pages.
Klein, "Measurements of Spectral Emission and Absorption of a High Pressure Xenon Arc in the Stationary and the Flashed Modes", 1968, pp. 677-685.
Klocke et al., "Investigation into the Use of High Power Diode Lasers for Hardening and Thermal Conduction Welding of Metals", SPIE, vol. 3097, 1997, pp. 592-598.
Knyazev, "Photoresonance Plasma Production by Excimer Lasers as a Technique for Anode-plasma Formation", Nucl. Instr. and Meth. in Phys. Res. A, vol. 415, 1998, pp. 525-532.
Kolb et al., "Low Optical Loss Synthetic Quartz", Mat. Res. Bull. vol. 7, 1972, pp. 397-406.
Kondow et al., "Temperature Dependence of Lasing Wavelength in a GaInNAs Laser Diode", IEEE Photonics Technology Letters, vol. 12, No. 7, 2000, pp. 777-779.
Kopecek et al., "Laser Ignition of Methane-Air Mixtures at High Pressures and Diagnostics", Journal of Engineering for Gas Turbines and Power, vol. 127, 2005, pp. 213-219.
Kopecek et al., "Laser-Induced Ignition of Methane-Air Mixtures at Pressures up to 4 MPa", Laser Physics, vol. 13, No. 11, 2003, pp. 1365-1369.
Korn et al., "Ultrashort 1-kHz Laser Plasma Hard X-ray Source", Optics Letters, vol. 27, No. 10, 2002, pp. 866-868.
Kozlov et al., "Radiative Losses by Argon Plasma and the Emissive Model of a Continuous Optical Discharge", Soy. Phys. JETP, vol. 39, No. 3, Sep. 1974, pp. 463-468.
Kozlov et al., "Sustained Optical Discharges in Molecular Gases," Sov. Phys. Tech. Phys. vol. 49, No. 11, Nov. 1979, pp. 1283-1287.
Kranzusch et al., "Spatial Characterization of Extreme Ultraviolet Plasmas Generated by Laser Excitation of Xenon Gas Targets", Review of Scientific Instruments, vol. 74, No. 2, 2003, pp. 969-974.

(56) References Cited

OTHER PUBLICATIONS

Krushelnick et al., "Plasma Channel Formation and Guiding during High Intensity Short Pulse Laser Plasma Experiments", Physical Review Letters, vol. 78, No. 21, 1997, pp. 4047-4050.
Ku et al., "Decay of Krypton 1(s)(2) and 1(s)(3) Excited Species in the Late Afterglow", Physical Review A, vol. 8, No. 6, 1973, pp. 3123-3130.
Kubiak et al., "Scale-up of a Cluster Jet Laser Plasma Source for Extreme Ultraviolet Lithography", SPIE, vol. 3676, 1999, pp. 669-678.
Kuhn, "Laser Engineering", 1998, pp. 303-343, 365-377, 384-440.
Kurkov et al., "CW Medium-Power Fiber Lasers for Near IR Range", Proceedings of SPIE, vol. 5449, 2004, pp. 62-69.
Lackner et al., "The Optical Spark Plug: Window-related Issues", Institute of Chemical Engineering, Vienna University of Technology, 2005, pp. 1-6.
Lange et al., "Tunable Diode Laser Absorption Spectroscopy for Plasmas at Elevated Pressures", Proceedings of SPIE Vo. 4460, 2002, pp. 177-187.
Laufer et al., "Effect of Temperature on the Vacuum Ultraviolet Transmittance of Lithium Fluoride, Calcium Fluoride, Barium Fluoride, and Sapphire", Journal of The Optical Society of America, vol. 55, No. 1, 1965, pp. 64-66.
Laufer, "Introduction To Optics And Lasers In Engineering", 1996, pp. 449-454.
Legall et al., "Spatial and Spectral Characterization of a Laser Produced Plasma Source for Extreme Ultraviolet Metrology", Review of Scientific Instruments, vol. 75, No. 11, 2004, pp. 4981-4988.
Lenses and Curved Mirrors, University of Delaware, Imaging (last visited Dec. 19, 2015), pp. 24-29.
Leonov et al., "Mechanisms of Resonant Laser Ionization", JETP, vol. 8, No. 4, 1997, pp. 703-715.
Lewis et al., "Measurements of CW Photoionization for the Use in Stable High Pressure Tea Laser Discharge", IEEE Nuclear and Plasma Sciences Society, 1975, pp. 14-45.
Li et al., "Density measurements of a high-density pulsed gas jet for laser-plasma interaction studies", Meas. Sci. Technol., vol. 5, 1994, pp. 1197-1201.
Li, "The Advances and Characteristics of High-Power Diode Laser Materials Processing", Optics and Lasers in Engineering, vol. 34, 2000, pp. 231-253.
Liao et al., "An efficient Ni Kα X-ray Source Driven by a High Energy Fiber CPA System", Center for Ultrafast Optical Science, 2007, pp. CP1-4-THU.
Liao et al., "Generation of Hard X-rays Using an Ultrafast Fiber Laser System", Optics Express, vol. 15, No. 21, 2007, pp. 13942-13948.
Light Hammer, 10 Mark II UV Lamp System, Heraeus Noblelight America LLC, 2015, pp. 1-20.
Light Hammer, 6 UV Lamp System Parts Listing, Heraeus Noblelight America LLC, 2015, pp. 1-22.
Lo et al., "Resonance-Enhanced LIBS", Department of Physics, 2002, pp. 15-17.
Lowe et al., "Developments in Light Sources and Detectors for Atomic Absorption Spectroscopy", Spectrochimica Acta Part B., vol. 54, 1999, pp. 2031-2039.
Lui et al., "Resonance-Enhanced Laser-Induced Plasma Spectroscopy: Time-Resolved Studies and Ambient Gas Effects", Department of Physics, 2002, pp. 19-21.
Luo et al., "Sapphire (0 0 0 1) Surface Modifications Induced by Long-Pulse 1054 nm Laser Irradiation", Applied Surface Science, vol. 253, 2007, pp. 9457-9466.
MacDowell et al., "Reduction imaging with soft x rays for projection lithography", Review Of Scientific Instruments, vol. 63, No. 1, 1992, pp. 737-740.
Maclean et al., "Direct Diode Laser Pumping of a Ti:Sapphire Laser", Institute of Photonics, SUPA, 2009, pp. 1-3.
Magner et al., "Self-Compression of Ultrashort Pulses through Ionization-Induced Spatiotemporal Reshaping", Physical Review Letter, vol. 93, No. 17, 2004, pp. 173902-1-173902-4.
Mahmoud et al., "Ion Formation in Laser-Irradiated Cesium Vapor", Journal of Quantitative Spectroscopy & Radiative Transfer, vol. 102, 2006, pp. 241-250.
Malik et al., "Spectroscopic Measurements on Xenon Plasma in a Hollow Cathode", 2000, J. Phys. D: Appl. Phys., vol. 33, pp. 2037-2048.
Malka et al., "Channel Formation in Long Laser Pulse Interaction with a Helium Gas Jet", Physical Review Letters, vol. 79, No. 16, 1997, pp. 2979-2982.
Mandel'shtam et al., "Investigation of the Spark Discharge Produced in Air by Focusing Laser Radiation II", Soviet Physics JETP, vol. 22, No. 1, 1966, pp. 91-96.
May, "Infrared Optogalvanic Effects in Xenon", Optics Communications, vol. 64, No. 1, 1987, pp. 36-40.
Mazumder et al., "Spectroscopic Studies of Plasma During CW Laser Gas Heating in Flowing Argon", J. Appl. Phys., vol. 62, No. 12, 1987, pp. 4712-4718.
Measures et al., "Fast and Efficient Plasma Heating Through Superelastic Laser Energy Conversion", J. Appl. Phys., vol. 51, No. 7, 1980, pp. 3622-3628.
Measures et al., "Laser interaction based on resonance saturation (LIBORS): an alternative to inverse bremsstrahlung for coupling laser energy into a plasma", 1979, Applied Optics, vol. 18, No. 11, pp. 1824-1827.
Measures et al., "TABLASER: Trace (Element) Analyzer Based on Laser Ablation and Selectively Excited Radiation", Applied Optics, vol. 18, No. 3, 1979, pp. 281-286 (1979).
Measures, "Electron Density and Temperature Elevation of a Potassium Seeded Plasma by Laser Resonance Pumping",J. Quant. Spectrose. Radial. Transfer. vol. 10, 1970, pp. 107-125.
Mercury Vapor Light Source, Model OS-9286A.
Michel et al., "Analysis of Laser-Induced Breakdown Spectroscopy Spectra: The Case for Extreme Value Statistics", Spectrochimica Acta Part B, vol. 62, 2007, pp. 1370-1378.
Michel et al., "Laser-Induced Breakdown Spectroscopy of Bulk Aqueous Solutions at Oceanic Pressures: Evaluation of Key Measurement Parameters", Applied Optics, vol. 46, No. 13, 2007, pp. 2507-2515.
Milian et al., "Dynamic Compensation of Chromatic Aberration in a Programmable Diffractive Lens", Optical Express, vol. 14, No. 20, 2006, pp. 9103-9112.
Millard et al., "Diode Laser Absorption Measurements of Metastable Helium in Glow Discharges", Plasma Sources Sci. Technol., vol. 7, 1998, pp. 288-394.
Mills et al., "Argon-Hydrogen-Strontium Discharge Light Source", IEEE Transactions On Plasma Science, vol. 30, No. 2, 2002, pp. 639-652.
Mills et al., "Excessively Bright Hydrogen-Strontium Discharge Light Source Due to Energy Resonance of Strontium with Hydrogen", J. Plasma Physics, vol. 69, Part 2, 2003, pp. 131-158.
Mizoguchi et al., "Development of Light Source for Lithography at Present and for the Future", vol. 59, No. 166, 2013, pp. 1-7.
Mizoguchi et al., Development of CO2 Laser Produced Xe Plasma EUV Light Source for Microlithography, Proc. Of SPIE, vol. 6151, 2006, pp. 61510S-1.
Mobarhan, "Test and Characterization of Laser Diodes: Determination of Principal Parameters", 1999, pp. 1-7.
Moody, "Maintenance of a Gas Breakdown in Argon Using 10.6-μ cw Radiation", Journal of Applied Physics, vol. 46, No. 6, Jun. 1975, pp. 2475-2482.
Mora, "Theoretical Model of Absorption of Laser Light by a Plasma", Phys. Fluids, vol. 25, No. 6, 1982, pp. 1051-1056.
Mordovanakis et al., "Demonstration of Fiber-laser-produced Plasma Source and Application to Efficient Extreme UV Light Generation", Optics Letter, vol. 31, No. 17, 2006, pp. 2517-2519.
Mosier-Boss et al., "Detection of Lead Derived from Automotive Scrap Residue Using a Direct Push Fiber-Optic Laser-Induced Breakdown Spectroscopy Metal Sensor", Applied Spectroscopy, vol. 59, No. 12, 2005, pp. 1445-1456.
Mosier-Boss et al., "Field Demonstrations of a Direct Push FO-LIBS Metal Sensor", Environ. Sci. Technol., vol. 36, 2002, pp. 3968-3976.

(56) References Cited

OTHER PUBLICATIONS

Motomura et al., "Temporal VUV Emission Characteristics Related to Generations and Losses of Metastable Atoms in Xenon Pulsed Barrier Discharge", J. Light & Vis. Env. vol. 30, No. 2, 2006, pp. 81-86.
Moulton, "Tunable Solid-State Lasers", Proceedings of the IEEE, vol. 80, No. 3, 1992, pp. 348-364.
Muller et al., "Theoretical Model for a Continuous Optical Discharge", Physica, 112C, 1982, pp. 259-270.
Nagano et al., "Present Status of Laser-Produced Plasma EUV Light Source", Proc. Of SPIE, vol. 7636, 2010, pp. 76363C-1-76363C-9.
Nakar et al., "Radiometric Characterization of Ultrahigh Radiance Xenon Short-Arc Discharge Lamps, Ben-Gurion University", Applied Optice, vol. 47,No. 2, Jan. 9, 2008.
Neukum, "Vom Halbleiterchip zum Laserwerkzeug", 2007, pp. 18-20.
Nikitin et al., "Guiding of Intense Femtosecond Pulses in Preformed Plasma Channels", Optics Letter, vol. 22, No. 23, 1997, pp. 1787-1789.
Norimatsu et al., "Cryostat to Provide a Solid Deuterium Layer in a Plastic Shell for the Gekko XII Glass Laser System", Review Of Scientific Instruments, vol. 63, No. 6, 1992, pp. 3378-3383.
Zimakov, "Continuous Optical Discharges Sustained by Near-IR Laser Radiation", 42th international conference on plasma physics and CF, 2015, p. 1.
OEM Compact Fiber Laser module 1090nm 10-20W CW/M With GTWave Technology, SPI Lasers LLC.
Oettinger et al., Plasma Ionization Enhancement by Laser Line Radiation, AIAA Journal, vol. 8, No. 5, 1970, pp. 880-885.
Zhang et al., "Designing a High Performance TEC Controller", Proceedings of SPIE vol. 4913, 2002, pp. 177-183.
Zajac et al., "10 W cw Nd-Doped Double-clad Fiber Laser Operating at 1.06 μm", Proceedings of SPIE vol. 5036, 2003, pp. 135-138.
Yusim et al., "100 Watt, single-mode, CW, Linearly Polarized All-fiber Format 1.56um Laser with Suppression of Parasitic Lasing Effects", Proceedings of SPIE, vol. 5709, 2005, pp. 69-77.
Yoshizawa et al., "Disk-shaped Vacuum Ultraviolet Light Source Driven by Microwave Discharge for Photoexcited Processes", Appl. Physc. Lett., vol. 559, 1991, pp. 1678-1680.
Yoshino et al., "Absorption Spectrum of Xenon in the Vacuum-Ultraviolet Region",J. Opt. Soc. Am. B/vol. 2, No. 8, 1985, pp. 1268-1274.
Orth et al., "High-Resolution Spectra of Laser Plasma Light Sources in the Normal Incidence XUV Region", Applied Optics, vol. 25, No. 13, 1986, pp. 2215-2217.
OSRAM Opto Semiconductors Announces New Solutions for Laser Applications; New Offerings Provide High Output and Enhanced Reliability, Business Wire, Jun. 28, 2005, pp. 1-3.
Oxford Dictionary of Astronomy, definition of bound-bound transition, 2003, p. 59.
Pankert et al., "EUV Sources for the Alpha-Tools", Proc. Of SPIE, vol. 6151, 2006, pp. 1-9.
Pappas et al., "Formation of a Cesium Plasma by Continuous-Wave Resonance Excitation", Applied Spectroscopy, vol. 54, No. 8, 2000, pp. 1245-1249.
Parker, "McGraw-Hill Dictionary of Scientific and Technical Terms",5th Edition, 1994, p. 561.
Patel et al., "The Suitability of Sapphire for Laser Windows",Meas. Sci. Technol., vol. 10, 1999, pp. 146-151.
Pebler et al., "Stabilizing the Radiant Flux of a Xenon Arc Lamp", Applied Optice, vol. 20, No. 23, 1981, pp. 4059-4061.
Perry, "Solar Thermal Propulsion: An Investigation Of Solar Radiation Absorption In A Working Fluid", 1984 pp. 1-70.
Petring et al., "High Power Diode Lasers", Technology and Applications, 2007, pp. 285-533.
Phillip, "Optical Properties of Non-Crystalline Si, SiO, SiOx and SiO2", J. Phys. Chem. Solids, vol. 32, 1971, pp. 1935-1945.
Phillip, "Optical Transitions in Crystalline and Fused Quartz", Solid State Communications vol. 4, 1966, pp. 73-75.
Phillips et al., "Characterization and Stabilization of Fiber-Coupled Laser Diode Arrays", Review Of Scientific Instruments, vol. 70, No. 7, 1999, pp. 2905-2909.
Plyler et al., "Precise Measurement of Wavelengths in Infrared Spectra", Journal of Research of the National Bureau of Standards, vol. 55, No. 5, 1955, pp. 279-284.
Polijanczuk et al., "Semiconductor Lasers for Microsoldering", 1991, pp. 6/1-6/4.
Prabhu et al., "High-Power CW Raman Fiber Laser Using Phosphosilicate Fiber Pumped by Yb-doped Double-clad Fiber Laser", IEE Colloquium on Advances in Interconnection Technology, 2001, pp. 482-485.
Raizer, "Continuous Optical Discharge: Generation and Support of Dense Low-Temperature Plasma by Laser Irradiation", 1996, pp. 87-94.
Raizer, "Gas Discharge Physics", 1991, pp. 1-449.
Raizer, "Optical Discharges," Sov. Phys. Usp., vol. 23, No. 11, 1980, pp. 789-806.
Rhemet, "Xenon Lamps", IEE Proc., vol. 127, Pt. A, No. 3, 1980, pp. 190-195.
Richardson et al., "High Conversion Efficiency Mass-Limited Sn-Based Laser Plasma Source for Extreme Ultraviolet Lithography", J. Vac. Sci. Technol. B., vol. 22, No. 2, 2004, pp. 785-790.
Rietdorf et al., "Special Optical Elements", J. (eds) Handbook Of Biological Confocal Microscopy, 2006, pp. 43-58.
Rockstroh et al., "Spectroscopic Studies of Plasma During CW Laser Materials Interaction", J. Appl. Phys., vol. 61, No. 3, 1987, pp. 917-922.
Roth et al., "Directly Diode-laser-pumped Ti:sapphire laser", Optics Letters, vol. 34, No. 21, 2009, pp. 3334-3336.
Sacchi, "Laser-Induced Electric Breakdown in Water", J. Opt. Soc. Am. B, vol. 28, No. 2, 1991, pp. 337-345.
Sakamoto et al., "120W CW Output Power from Monolithic AlGaAs (800nm) Laser Diode Array Mounted on Diamond Fleatsink", Electronic Letter, vol. 28, No. 2, 1992, pp. 197-199.
Saloman, "Energy Levels and Observed Spectral Lines of Xenon, Xe(I) through Xe(LIV)", J. Phys. Chem. Ref. Data, vol. 33, No. 3, 2004, pp. 765-921.
Saraswat et al., "Single Wafer Rapid Thermal Multiprocessing", Mat. Res. Soc. Symp. Proc. vol. 146, 1989, pp. 3-13.
Ballard et al., "High-Power, Laser-Produced-Plasma EUV Source",Proc. SPIE, vol. 4688, 2002, pp. 302-309.
Chen et al., "High-temperature Operation of Periodic Index Separate Confinement Heterostructure Quantum Well Laser", Apll. Phys. Lett., vol. 59, No. 22, 1991, pp. 2784-2786.
Coffey, "Fiber Lasers Achieve World-Record Powers", 2003, pp. 13-14.
Coherent, "Conduction-Cooled Bar Packages (CCPs), 965-985 nm", 2015, pp. 1-4.
Cohn et al., "Magnetic-Field-Dependent Breakdown of CO2-Laser-Produced Plasma", Appl. Phys. Lett., vol. 20, No. 6, 1972, pp. 225-227.
Cooley et al., "Fundamentals of Discharge Initiation in Gas-Fed Pulsed Plasma Thrusters", The 29th International Electric Propulsion Conference, Princeton University, 2005, pp. 1-11.
Cooper, "Spectroscopic Identification of Water-Oxygen and Water-Hydroxyl Complexes and their Importance to Icy Duter Solar System Bodies", Chemistry School of Biomedical and Chemical Sciences, 2004, pp. 1-116.
Cremers et al., "Evaluation of the Continuous Optical No. 4, 1985, pp. 665-679. Discharge for Spectrochemical Analysis," Spectrochimica Acta, vol. 40B, No. 4, 1985, pp. 665-679.
Cross et al., "High Kinetic Energy (1-10eV) Laser Sustained Neutral Atom Beam Source", Nuclear Instruments and Methods in Physics Research B13, 198, pp. 658-662.
Cu-Nguyen et al., "Tunable Confocal Hyperspectral Imaging System", Optical MEMS and Nanophotonics, 2013, pp. 9-10.
Cu-Nguyen et al., "Tunable Hyperchromatic Lens System for Confocal Hyperspectral Sensing", Optics Express, vol. 21, No. 13, 2013, pp. 27611-27621.
Daily et al., "Two-Photon Photoionization of the Ca 4s3d(1)D(2) Level in an Optical Dipole Trap", Physical Review A, vol. 71, 2005, pp. 043406-1-343406-5.

(56) References Cited

OTHER PUBLICATIONS

Davis, "Lasers And Electra-Optics: Fundamentals And Engineering", 1996, pp. 1-35.
De Jong et al., "A Pulsed Arc-Glow Hollow Cathode Lamp", Spectroehimlea Acta, vol. 29B, 1974, pp. 179-190.
Demtroder, "Laser Spectroscopy: Basic Concepts And Instrumentation", Second Enlarged Edition, 1982, pp. 395-398.
Derra et al., "UHP Lamp Systems for Projection Applications", J. Phys. D: Appl. Phys. vol. 38, 2005, pp. 2995-3010.
DET25K—GaP Detector, 150-550 nm, 1 ns Rise Time, 4.8 mm2, 8-32 Taps, Thorlabs, 2005, p. 1.
Digonnet, "Rare-Earth-Doped Fiber Lasers And Amplifiers", Optical Engineering, 2001, pp. 144-170.
Diwakar et al., "Role of Laser Pre-Pulse Wavelength and Inter-Pulse Delay on Signal Enhancement in Collinear Double-Pulse Laserlinduced Breakdown Spectroscopy", Spectrochimia Acta, Part B, 2013, pp. 65-73.
Dorsch et al., "Performance and Lifetime of High-Power Diode Lasers and Diode Laser Systems", Proc. SPIE, vol. 3628, 1999, pp. 56-63.
Dorsch et al., 2 KW cw Fiber-coupled Diode Laser System, Proceedings of SPIE vol. 3889, 2000, pp. 45-53.
Durfee III et al., "Development of a Plasma Waveguide for High-Intensity Laser Pulses", Physical Review E, vol. 51, No. 3, 1995, pp. 2368-2389.
Dusterer et al., "Optimization of EUVRradiation Yield from Laser-Produced Plasma", Appl. Phys., B-73, 2001, pp. 693-698.
Eckstrom et al., "Microwave Interactions With Plasmas", IEEE Trans. Plasma Sci. vol. 18, 1992, pp. 1-9 with appendixes.
Edmund Optics, Lens UV-SCX 25MM DIA x 25MM FL Uncoated (Drawing), p. 1.
Eletskii et al., "Formation kinetics and parameters of a photoresonant plasma", Soy. Phys. JETP, vol. 67, No. 5, 1988, pp. 920-924.
Emmett et al., "Direct Measurement of Xenon Flashtube Opacity", Journal of Applied Physics, vol. 35, No. 9, 1964, pp. 2601-2604.
Endo et al., "Laser Produced EUV Light Source Development for HVM", SPIE Advanced Lithography, 2007, pp. 1-25.
Erskine et al., "Measuring Opacity of Shock Generated Argon Plasmas",J. Quart Spectro. Radial Transfer, vol. 51, No. 12, 1994, pp. 97-100.
F10T/F10T2 and F6 Lightshield Systems Parts Listing, Heraeus Noblelight America LLC, 2015, pp. 1-12.
F300S/F300SQ UV Lamp System Parts Listing, Heraeus Noblelight America LLC, 2015, pp. 1-26.
Feng et al., "A stigmatic Ultraviolet-Visible Monochromator for Use with a High Brightness Laser Driven Plasma Light Source", Review of Scientific instruments, vol. 84, 2013, pp. 1-6.
Fiedorowicz et al., "X-Ray Emission form Laser-Irradiated Gas Puff Targets," Appl. Phys. Lett., vol. 62, No. 22, May 31, 1993, pp. 2778-2780.
Fomenkov et al., "Laser Produced Plasma Light Source for EUVL", Cymer Inc., 17075 Thommint Court, San Diego, CA 92127, USA, 2011, pp. 1-6.
Franzen, "Continuous Laser-Sustained Plasmas", 1973, J. Appl. Phys., vol. 44, pp. 1727-1732.
Franzen, "CW Gas Breakdown in Argon Using 10.6-µm Laser Radiation," Appl. Phys. Lett., vol. 21, No. 2, Jul. 15, 1972, pp. 62-64.
Frey et al., "Spectroscopy and kinetics of the ionic cesium flouride excimer excited by a Laser-Produced Plasma", Journal of the Optical Society of America B, vol. 6, No. 8, 1989, pp. 1529-1535.
Fujimoto et al., "High Power InGaAs/AlGaAs laser Diodes with Decoupled Confinement Heterostructure", SPIE vol. 3628, 1999, pp. 38-45.
Galvanauskas, "Fiber laser based EUV lithography sources", Panel discussion presentation at the SEMATECH EUV Source Workshop (2007).
Geisler et al., "Spectrometer System Using a Modular Echelle Spectrograph and a Laser-Driven Continuum Source for Simultaneous Multi-Element Determination by Graphite Furnace Absorption Spectrometry", Spectrochimica Acta Part B, vol. 107, 2015, pp. 11-16.
Generalov et al., "Experimental Investigation of a Continuous 1972, pp. 763-769. Optical Discharge," Soviet Physics JETP, vol. 34, No. 4, Apr. 1972, pp. 763-769.
Gentile et al., "Oxidative Decontamination of Tritiated Materials Employing Ozone Gas", PPPL, 2002, pp. 1-9.
Gentile et al., "Tritium Decontamination of TFTR D-T Graphite Tiles Employing Ultra Violet Light and a Nd:YAG Laser", Japan Atomic Energy Research Institute, 1999, p. 321-322.
George et al., "13.5 nm EUV Generation from Tin-doped Droplets Using a Fiber Laser", Optics Express, vol. 15, No. 25, 2007, pp. 16348-16356.
Girard et al., "Generating Conditions of a Laser-Sustained Argon Plasma Jet",J. Phys. D: Appl. Phys., vol. 26, 1993, pp. 1382-1393.
Glangetas, "New Design for a Microwave Discharge Lamp", Rev. Sci. Instrum., vol. 51, No. 3, 1980, pp. 390-391.
Griem, "Plasma Spectroscopy", 1964, pp. 172-176.
Gullikson et al., "A Soft X-Ray/EUV Reflectometer Based on a Laser Produced Plasma Source", Journal: Journal of X-Ray Science and Technology, vol. 3, No. 4, 1992, pp. 283-299.
Gwyn, "EVU Lithography Update: The timeline puts the screws to extreme ultraviolet lithography, but engineers rise to the challenge", SPIE, 2002, pp. 1-4.
Hadal et al., "Influence of Ambient Gas on the Temperature and Density of Laser Produced Carbon Plasma", Appl. Phys. Lett. vol. 72, No. 2, 1998, pp. 167-169.
Abe et al., "KrF Laser Driven Xenon Plasma Light Source of a Small Field Exposure Tool", Proc. Of SPIE, vol. 6151, 2006, pp. 61513T-1-61513T-5.
Agrawal et al., "Infrared And Visible Semiconductor Lasers", 1993, pp. xiii-616.
Agrawal et al., "Semiconductor Lasers", Second edition, 1993, p. 547.
Ahmed et al., "Laser Optogalvanic Spectroscopic Studies of Xenon", J. Phys. B: At. Mol. Opt. Phys. 31, 1998, pp. 4017-4028.
Aitoumeziane et al., "Theoretical and Numerical Study of the Interaction of a Nanosecond Laser Pulse with a Copper Target for Laser-Induced Breakdown Spectroscopy Applications", J. Opt. Soc. Am. B, vol. 31, No. 1, 2014, pp. 53-61.
Al-Muhanna et al., High-Power (>10 W) Continuous-Wave Operation from 100-um-Aperture 0.97-um-emitting Al-Free Diode Lasers, Applied Physics Letters, vol. 73, No. 9, Aug. 31, 1998, pp. 1182-1184.
Angel, "LIBS Using Dual-Laser Pulses", 2002, p. 14.
Apter, "High-power Diode Lasers Offer Efficient Answer, Product Guide", 2005, pp. 1-3.
Aragon et al., "Determination of Carbon Content in Molten Steel Using Laser-Induced Breakdown Spectroscopy", 1993, pp. 306-608.
Arieli, Excitation of Gas Laser by Optical Pumping, Chapter 6.1, Gas Laser, 2006, p. 2b.
Arp et al., "Argon Mini-Arc Meets its Match: Use of a Laser-Driven Plasma Source in Ultraviolet-Detector Calibrations" Applied Optics vol. 53, Issue 6 , 2014, pp. 1089-1093.
Arp et al., "Feasibility of Generating a Useful Laser-Induced Breakdown Spectroscopy Plasma on Rocks at High Pressure: reliminary Study for a Venus Mission", Spectrochimica Acta Part B 59, 2004, pp. 987-999.
Arzuov et al., Self-Maintenance of a Continuous Optical Discharge in Gases Near Solid Targets, Soy. J. Quant. Electron., vol. 5, No. 5, 1975, pp. 523-525.
Azuma et al., Debris from Tape-Target Irradiated with Pulsed YAG Laser, Applied Surface Science, 2002, pp. 224-228.
B 11 3mmaxoe, 011THLIECKHE PA3PFIRb1,110flREPK4BAEMbIE I4311YLIEHMEM J1A3EPOB Efill)KHEI-0 ilk-I4-EIA11A3OHA Ommixo-xmknyeckasi Kmue-rma B ra3ouoii gmuamme, www.chemphys.edu.ru/pdf/2014-11-29-001.pdf.
B.B. Kostin, I4311YLIEH14EF1J1A3Mb1, HAIPETOC4 KOPOTKI4MI4 11A3EPHb1MI4 14M11YllbCAM14 23(2) 014314KA EfflA3Mb1 118 (1997).

(56) References Cited

OTHER PUBLICATIONS

B.T. Apxpinkmu and A. K. Dona HEIII4HEOHAFI 011T14KA I4 11PEOBPA3OBAHHE CBETA B IA3AX 153(3) YalEXI4IM3I44ECK14X HAYK 423 (1987).
Babucke et al., "On the Energy Balance in the Core of Electrode-Stabilized High-Pressure Mercury Discharges", J. Phys. D: Appl. Phys. vol. 24, 1991, pp. 1316-1321.
Bachmann, "Goals and status of the German national research initiative BRIOLAS (brilliant diode lasers)", Proc. of SPIE vol. 6456, 2007, 645608-1.
Bachmann, "Industrial Applications of High Power Diode Lasers in Materials Processing", Applied Surface Science, 208-209, 2003, pp. 125-136.
Baer, "Plasma Diagnostics With Semiconductor Lasers Using Fluorescence And Absorption Spectroscopy", Stanford University ProQuest Dissertations Publishing, 1993, pp. 1-194.
Ball, "Raman Spectroscopy", vol. 17, No. 2, 2002, pp. 50-52.
Ballman et al., "Synthetic Quartz with High Ultraviolet Transmission", Applied Optics, vol. 7, No. 7, 1968, pp. 1387-1390.
Barnes et al., "Argon Arc Lamps", Applied Optics, vol. 24, No. 13, 1985, pp. 1947-1949.
Barnes et al., "High Power Diode Laser Cladding", Journal of Materials Processing Technology, vol. 138, 2003, pp. 411-416.
Bartz et al., "Optical Reflectivity Measurements Using a Laser Plasma Light Source", Appl. Phys. Lett. vol. 55, No. 19, 1989, pp. 1955-1957.
Bataller et al., "Nanosecond High-Power Dense Microplasma Switch for Visible Light", Applied Physics Letters, vol. 105, 2014, pp. 1-5.
Bauder, Radiation from High-Pressure Plasmas, Journal of Applied Physics, vol. 39, No. 1, 1968, pp. 148-152.
Beam Samplers; UV Fused Silica Beam Samplers, (AR Coating: 250-420 nm) (AR Coating: 350-700 nm) (AR Coating: 550-1050 nm) (AR Coating: 1050-1700 nm), 3 pages.
Beck, "Simple Pulse Generator for Pulsing Xenon Arcs with High Repetition Rate," Rev. Sci. Instrum., vol. 45, No. 2, Feb. 1974, pp. 318-319.
Belasri et al., "Electrical Approach of Homogenous High Pressure NeIXe/CHI Dielectric Barrier Discharge for XeCl (308 nm) Lamp", Plasma Chem Plasma Process, vol. 31, 2011, pp. 787-798.
Bloch et al., "Field Test of a Novel Microlaser-Based Probe for in Situ Fluorescence Sensing of Soil Contamination", Applied Spectroscopy, vol. 52, No. 10, 1998, pp. 1299-1304.
Bogaerts et al., "Gas Discharge Plasmas and their Applications", Spectrochimica Acta Part B 57, 2001, pp. 609-658.
Bolshov et al., "Investigation of the Dynamic of an Expanding Laser Plume by a Shadowgraphic Technique", Spectrochimica Acta Part B 63, 2008, pp. 324-331.
Borghese et al., "Time-Resolved Spectral and Spatial Description of Laser-Induced Breakdown in Air as a Pulsed, Bright, and Broadband Ultraviolet—Visible Light Source", Applied Optics, vol. 37, No. 18, Jun. 20, 1998, pp. 3977-3983.
Brauch et al., "High-Power Diode Lasers for Direct Applications", Topics Appl. Phys., vol. 78, 1000, pp. 303-368.
Breton et al., "Vacuum-UV Radiation of Laser-Produced Plasmas", Journal of the Optical Society Of America, vol. 63, No. 10, 1973, pp. 1225-1232.
Bridges et al., "Investigation of a Laser-Produced Plasma VUV Light Source", Applied Optics, vol. 25, No. 13, Jul. 1, 1986, pp. 2208-2214.
Bridges, "Characteristics of an Opto-Galvanic Effect in Cesium and Other Gas Discharge Plasmas", J. Opt. Soc. Am., vol. 68, No. 3, Mar. 1978, pp. 352-360.
Bussiahn, R., et. al., "Experimental and theoretical investigations of a low-pressure He—Xe discharge for lighting purpose," Journal of Applied Physics, vol. 95, No. 9, May 1, 2004, pp. 4627-4634.
Byer, "Laser-Produced Plasmas: A Compact Soft X-Ray Source with High Peak Brightness", Defence Technical Information Centre, 1989, pp. 1-26.
C10T/C6 Lightshield System Parts Listing, Heraeus Noblelight America LLC, 2015, pp. 1-8.

Cann, "Light Sources in the 0.15-20-μ Spectral Range", Applied Optics, vol. 8, No. 8, 1969, pp. 1645-1661.
Carlhoff et al., "Continuous Optical Discharges at Very High Pressure," Physica 103C, 1981, pp. 439-447.
Carlhoff et al., "High Pressure Optical Discharges", Journal of Physics, 1979, pp. 757-758.
Cedolin et al., "Laser-Induced Fluorescence Measurements of Resonance Broadening in Xenon", Physical Review A, vol. 54, No. 1, 2006, pp. 335-342.
Cedolin, "Laser-Induced Fluorescence Diagnostics Of Xenon Plasmas", 1997, pp. 1-96.
Cermax lamps, including models LX300F, LX1000CF, EX300-10F, EX500-13F, EX900C-10F, EX900C-13F, EX1000C-13F, LX125F, LX175F, LX500CF, EX125-10F, EX175-10F, EX500-10F,EX1000C-10F, EX900-10F;Perkin Elmer Optoelectronics.
Cesar et al., "High-power fibre lasers", Nature Photonics, vol. 7, 2013, pp. 861-867.
Chang et al., "Fiber Laser Driven EUV Generation", Conference on Lasers and Electro-Optics, 2005, pp. 2200-2202.
User Manual: Cyberlight, Cyberlight Cx, Cyberlight Sv (Version 2.0), High End Systems, Inc., (1996).
Ushio Super-High Pressure Mercury Lamps, including USH-102D, USH-102DH, USH-205DP, USH-2055, USH-206D/M4, USH-250D, USH-250BY, USH-350DS, USH-351DS, USH-350DP, USH-450G5, USH-450GL, USH-500BY, USH-500MB, USH-502MB, USH-500T, USH-505MC, USH-5085, USH-508SA, USH-5095, USH-1000DW, USH-1000MC, USH-1000KS, USH-1002DW, Ushio.
Vadla et al., "Resonantly Laser Induced Plasmas in Gases: The Role of Energy Pooling and Exothermic Collisions in Plasma Breakdown and Heating", Spectrochimica Acta Part B, vol. 65, 2010, pp. 33-45.
Vampola, "P78-2 Engineering Overview", Defence Technical Information Centre, 1981, pp. 1-36.
Vukanovic et al., "A New Type of D.C. Arc as Spectrochemical Light Source", Spectrochimica Acta, vol. 29B, 1974, pp. 33-36.
Wang, "Self-Assembled Indium Arsenide Quantum-Dash Lasers of Indium Phosphide Substrates", Electrical and Computer Engineering, 2002, pp. vi-150.
Waynant et al., "Electro-Optics Handbook", Eds., 20002, pp. 1-1000.
Webb et al., Handbook Of Laser Technology and Applications, Applications, vol. III, 2004, pp. 1587-1611.
Wei, "Transparent Ceramic Lamp Envelope Materials", J. Phys. D: Appl. Phys., vol. 38, 2005, pp. 3057-3065.
Weinrotter et al., "Application of Laser Ignition to Hydrogen-Air Mixtures at High Pressures", International Journal of Hydrogen Energy, vol. 30, 2005, pp. 319-326.
Weinrotter et al., "Laser Ignition of Engines", Laser Physics, vol. 15, No. 7,2005, pp. 947-953.
Wiehle et al., "Dynamics of Strong-Field Above-Threshold Ionization of Argon: Comparison Between Experiment and Theory", Physical Review A, vol. 67, 2003, pp. 063405-1-063405-7.
Wieman et al., "Using Diode Lasers for Atomic Physics", Rev. Sci. Instrum., vol. 62, No. 1, 1991, pp. 1-20.
Wilbers et al., "The Continuum Emission of an Arc Plasma," J. Quant. Spectrosc. Radiat. Transfer, vol. 45, No. 1, 1991, pp. 1-10.
Wilbers et al., "The VUV Emissivity of a High-Pressure Cascade Argon Arc from 125 to 200 nm," J. Ouant. Spectrosc. Radiat. Transfer, vol. 46, 1991, pp. 299-308.
Winter et al., "Experimental and Theoretical Investigations of a Helium-Xenon Discharge in Spot Mode", 28th ICGQP, 2007 pp. 1979-1982.
Wood, "Atomic Processes: Bound-bound transitions (Einstein coefficients)", available at http://www-star.st-and.ac.uk-kw25/teaching/nebulae/lecture06_einstein.pdf, 2014, pp. 1-10.
World Record Powers Achieved in Single-Mode Fiber Lasers—Powers Scalable to IkW and Beyond, Southampton Photonics, Inc., 2003, pp. 1-2.
Wroblewski et al., "An Experimental Investigation of the Continuous Optical Discharge", Journal of Physique, 1979, pp. 733-734.
Wu et al., "Extreme Ultraviolet Lithography: Towards the Next Generation of Integrated Circuits", vol. 7, 2009, pp. 1-4.
Xenakis et al., "Laser-plasma X-ray Generation Using an Injection-mode-locked XeCl Excimer Laser", J. Appl. Phys., vol. 71, No. 1, 1992, pp. 85-93.

(56) References Cited

OTHER PUBLICATIONS

Xu et al., "Wavelength- and Time-Resolved Investigation of Laser-Induced Plasmas as a Continuum Source", Applied Spectroscopy, vol. 47, No. 8, 1993, pp. 1134-1139.
Yamada et al., "Ionization Mechanism of Cesium Plasma Produced by Irradiation of Dye Laser", Jpn. J. Appl. Phys. vol. 31, 1992, pp. 377-380.

* cited by examiner

INDUCTIVELY COUPLED PLASMA LIGHT SOURCE

The section headings used herein are for organizational purposes only and should not be construed as limiting the subject matter described in the present application in any way.

INTRODUCTION

Numerous commercial and academic applications have a need for high brightness light in the extreme ultra-violet (EUV) region of the spectrum. For example, EUV light is needed for numerous industrial applications, including metrology, accelerated testing, photoresist, defect inspection, and microscopy. Other applications for EUV light include microscopy, spectroscopy, areal imaging, and blank mask inspection. These and other applications require EUV sources that have high reliability, small physical size, low fixed cost, low operating cost, and low complexity from these important sources of extreme ultraviolet photons.

SUMMARY

A plasma chamber according to the present teaching, which can be a plasma chamber for an ultraviolet light source, includes a plasma generation region that defines a plasma confinement region. A port is positioned adjacent to a side of the plasma generation region that allows generated ultraviolet radiation to pass out of the chamber. A gas feed port can be positioned proximate to the plasma generation region. A vacuum pump port can be positioned proximate to the plasma generation region.

A high voltage region is coupled to the plasma generation region. A grounded region is coupled to the high voltage region that defines an outer surface configured to be coupled to the ground and is dimensioned for receiving a surrounding inductive core. A width of the high voltage region is greater than the width of the grounded region. In various embodiments, a width of the high voltage region can be at least two times greater than the width of the grounded region. A width of the plasma generation region can also be less than the width of the grounded region.

An insulated region can be coupled to the grounded region and can be configured to be coupled to ground potential. The insulating region may also have an aperture for passing ultraviolet light. The insulated region can be configured to reduce negative potential proximate to the grounded region to reduce the attraction of ions generated in the plasma generation region. A gas feed port for providing gas to the plasma generation region can be positioned in the insulating region. A plasma diagnostic port can also be positioned in the insulating region. A port in the insulated region can include an aperture for passing ultraviolet light.

A mirror can be positioned adjacent to the grounded region that is oriented to reflect at least some light generated in the plasma generation region back to the plasma generation region. The mirror can be partially transmitting so that some light generated in the plasma passes through an output port.

An inner inductive core can be positioned around the plasma generation region to couple current into a plasma loop. An outer inductive core can be positioned around the inner inductive core. An inductive core can be positioned around a portion of the grounded region and configured to prevent current flow in the grounded region.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings described below are for illustration purposes only. The drawings are not necessarily to scale; emphasis is instead generally being placed upon illustrating principles of the teaching. The drawings are not intended to limit the scope of the Applicant's teaching in any way.

DESCRIPTION OF VARIOUS EMBODIMENTS

Figure 1:
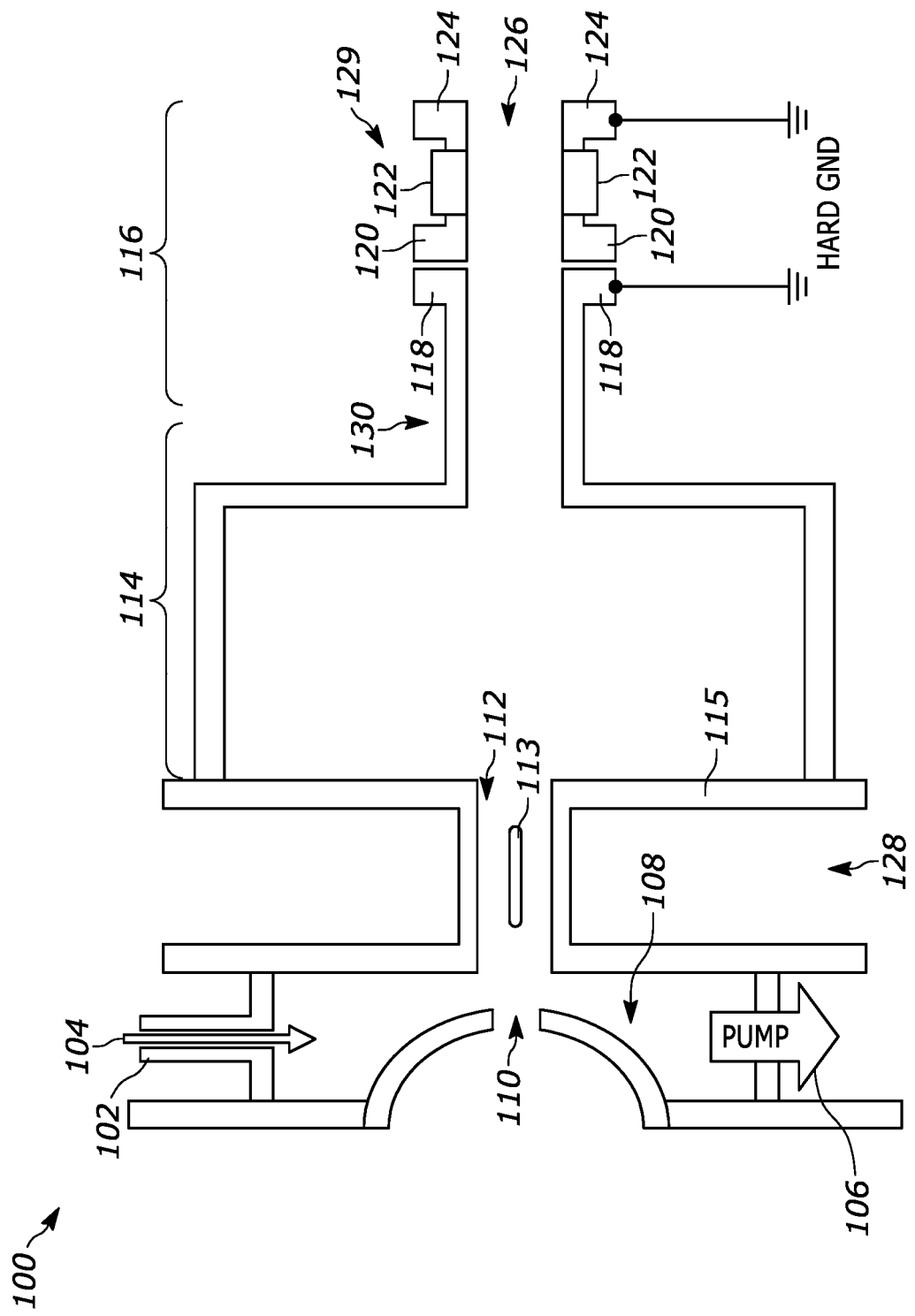
FIG. 1 illustrates a plasma chamber according to the present teaching for a Z-pinch ultraviolet light source.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications, and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching can be performed in any order and/or simultaneously as long as the teaching remains operable. Furthermore, it should be understood that the apparatus and method of the present teaching can include any number or all of the described embodiments as long as the teaching remains operable.

Extreme ultra-violet light sources play an important role in numerous optical measurement and exposure applications. It is desirable that these sources be configured to accommodate numerous use cases. One challenge is to generate high power and high brightness EUV light in a configuration that allows integration with numerous applications and also exhibits high stability and high reliability.

Extreme ultraviolet radiation is referred to in numerous ways by those skilled in the art. Some skilled in the art sometimes referred to extreme ultraviolet radiation as high-energy ultraviolet radiation, which can be abbreviated as XUV. Extreme ultraviolet radiation generally refers to electromagnetic radiation that is part of the electromagnetic spectrum nominally spanning wavelengths from 124 nm to 10 nm. There is some overlap between extreme ultraviolet radiation and what is considered to be the optical spectrum. One particular EUV wavelength of interest is 13.5 nm because that wavelength is commonly used for lithography. Extreme ultraviolet radiation sources, according to the present teaching, are not limited to the generation of EUV radiation. As is known in the art, plasmas can be used to generate a wide spectral range of photons. For example, plasmas generated according to the present teaching can also be used to generate soft x-ray photons (SXR). This includes, for example, photons with wavelengths of less than 10 nm.

So called Z-pinch plasmas, which have current in the axial direction, have been shown to be effective at producing EUV and SXR light. However, most known sources have employed electrodes to conduct high discharge currents into the plasma. These electrodes, which are typically in contact with high temperature plasma, can melt and produce significant debris, which is highly undesirable as it can greatly reduce the useful lifetime of the source.

Electrodeless approaches to generated EUV are desirable and would fill a considerable market need. Such sources are available, for example, from Energetiq, a Hamamatsu Company, located in Wilmington, MA These sources are based on a Z-pinch plasma, but avoid electrodes entirely by inductively coupling current into the plasma. The plasma in these EUV sources is magnetically confined away from the source walls, minimizing the heat load and reducing debris and providing excellent open-loop spatial stability, and stable repeatable power output. One challenge with known Z-pinch plasma chambers is that the high voltage region of the chamber walls obscures one side (referred to herein as the backside) of the Z-pinch region. This makes modifying the chamber to provide backside access difficult to impossible because there is no way to achieve ground potential in the high voltage region while the plasma is running.

One feature of the EUV sources of the present teaching is that they are versatile and support various applications. For example, the EUV source operating conditions are user-adjustable. In particular, EUV sources of the present teaching improve upon known Z-pinch designs because they can be optimized for peak power or for peak brightness as required by the user for a particular application. Plasma size can be typically below 1 mm in diameter under typical operating conditions. The design supports a simple and flexible optical interface provided to the user on one side of the system enclosure to connect to the application equipment. Custom interfaces can also be accommodated for particular applications.

Another feature of the EUV sources of the present teaching is that they accommodate two-sided optical access to the plasma chamber. This feature is provided, at least in part, by appropriate modifications to the high-voltage chamber used to generate the Z-pinch system condition.

FIG. 1 illustrates a plasma chamber 100 according to the present teaching for a Z-pinch ultraviolet light source. The chamber 100 includes an interface 102 that passes a target gas 104 into the chamber 100. A pump 106 is used to evacuate the chamber region 108 to a desired operating pressure and/or to control gas flow in the chamber 100.

A port 110 is provided to pass EUV radiation generated by the plasma. The port 110 can include a EUV output port that passes the desired EUV radiation. The port 110 can also be configured to include a filter structure that blocks undesired radiation. In some embodiments, the port 110 is configured to be opaque to visual light. For example, in various embodiments, the EUV transparent port 110 is an aperture that can include a spectral purifying foil. Typically, the port 110 is a beam-line aperture port that passes radiation propagating along the beamline. The port can also be configured to have a desired diameter so as to physically block light propagating in certain directions. Furthermore, the diameter of the aperture can be chosen to provide a desired pressure differential.

In various systems, the port 110 is configured to be adaptable for the user to attach to an application system (not shown) where the EUV radiation passes directly through the port 110. A plasma generation region 112 defines a plasma confinement region 113, described in more detail below, using magnetic induction. The plasma confinement region 113 is formed by a pulse forming and power delivery section 115, which carries a current that energizes cores (not shown) in operation. A high voltage region 114 is attached to the plasma generation region 112.

A grounded region 116 is attached to the high voltage region 114. The grounded region 116 has an outer surface that is coupled to ground at a first location 118. An insulating vacuum pipe 120 that includes an insulting break 122 is positioned adjacent to the first location 118. The insulating material forming the insulating break 122 can be formed of a ceramic or one or more other high temperature insulating materials like Polytetrafluoroethylene (PTFE) or similar materials. The vacuum pipe 120 is grounded at position 124 after the insulating break 122 near an input/output port 126 of the chamber 100. The insulating vacuum pipe 120 serves to provide an insulating break that reduces the negative potential to attract ions to further downstream components (not shown) in operation as desired.

The chamber 100 also includes regions 128, 130 to position magnets that provide inductive current flow for the chamber 100 in operation. The end of the region, first location 118, of the chamber 100 is also grounded. Together, the grounded insulating vacuum pipe 120 with insulating break 122 and grounded region 124 at the output port 126 can be referred to as an insulating region 129. One feature of the insulating region 129 of the chamber described herein is that it provides a safe, grounded, external region of the chamber that allows access by users and/or other downstream equipment from the outside of the chamber 100.

One feature of the present teaching is that the input/output port 126 defined by the insulating vacuum pipe 120 is configured for flexible connection of various downstream components (not shown). This feature supports various custom and semi-custom configurations of the chamber 100 to address different applications. For example, the input/output port 126 can form a gas feed port that provides gas to the plasma generation region 112. The input/output port 126 can form a plasma diagnostic port. This allows, for example, optical imaging, spectroscopy and/or electronic probing of the plasma in the plasma generation region 112 from the input/output port 126 during operation. The input/output port 126 can form an aperture for passing ultraviolet light that is generated from the plasma. The input/output port 126 can include a mirror positioned adjacent to the ground position 124. The mirror (not shown) can be fully or partially reflective and is oriented as desired to reflect at least some light generated in the plasma generation region 112 back to the plasma generation region 112. In some embodiments, the mirror is partially transmitting so that some light generated in the plasma generation region 112 passes through the input/output port 126, and some light is reflected back. In some embodiments, this light is EUV radiation generated in the plasma generation region, and in some embodiments this light can also include, for example, laser light or other light that interacts with and/or probes the plasma.

Figure 2A:
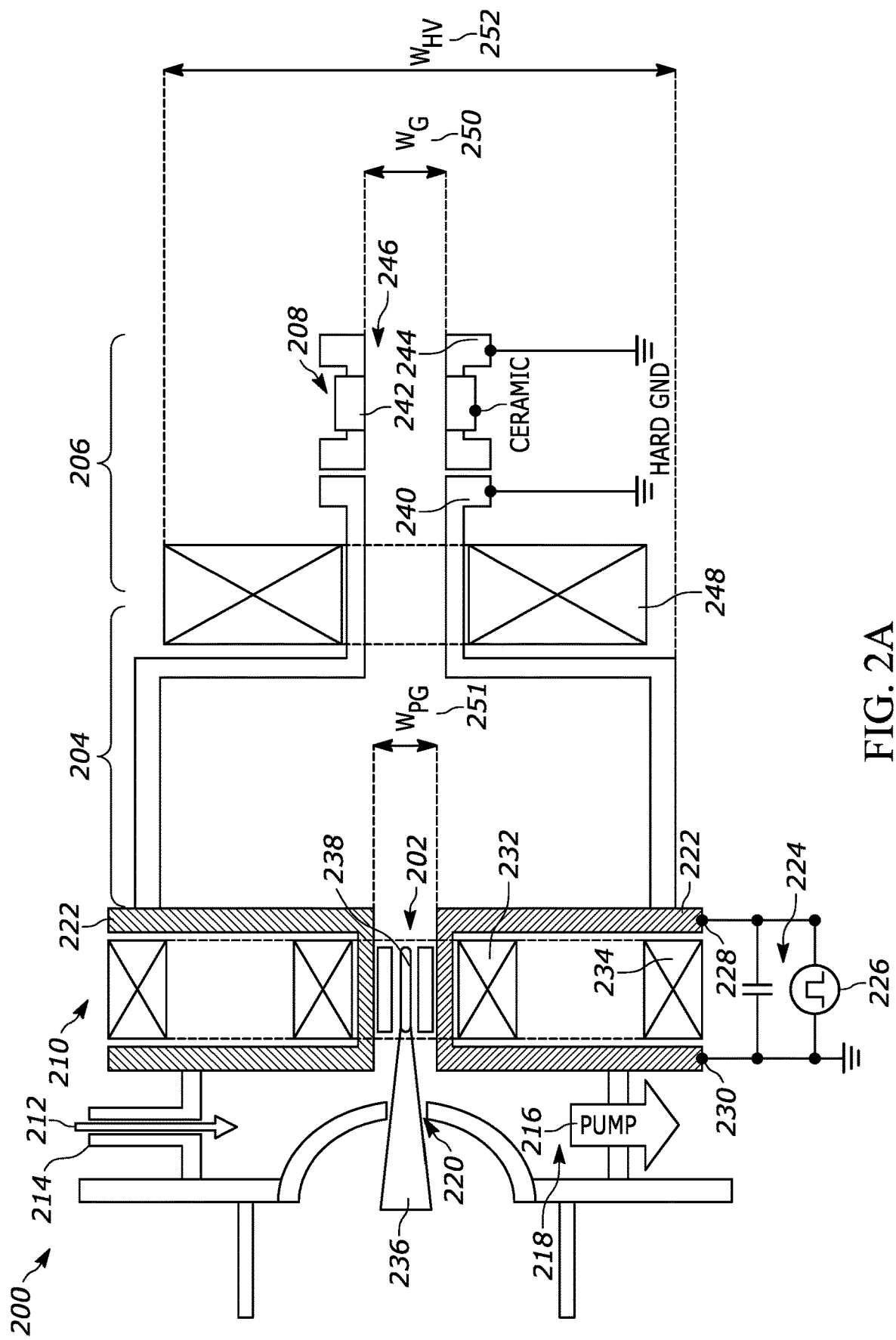
FIG. 2A illustrates an ultraviolet light source that includes a plasma confinement region, high voltage region, grounded region, and insulating region according to the present teaching.

FIG. 2A illustrates an ultraviolet light source 200 that includes a plasma confinement region 202, high voltage region 204, grounded region 206, and an insulating region 208, according to the present teaching. The source 200 is an inductive design that uses magnetic confinement of the plasma in the plasma confinement region 202 away from the components of the chamber 210 to provide high reliability and high stability. A target gas 212 enters through an interface 214 into the chamber 210. In some embodiments, the target gas is Xenon. A pump 216 is used to evacuate the chamber region 218 to a desired operating pressure. A port 220 is provided to pass EUV radiation, that is, EUV light 236 generated by the plasma.

A pulse forming and power delivery section 222 is driven using a parallel connected capacitor 224 and pulse generator 226 that drives a current to flow through the section 222 to the ground. The pulse generator 226 applies negative high-voltage pulses across the capacitor. In some embodiments, the capacitor 224 is a bank of multiple capacitors. Thus, the pulse forming and power delivery section 222 of the chamber 210 has a high voltage side 228 and a ground side 230. An inner magnetic core 232 and an outer magnetic core 234, energized by the current pulses flowing through pulse forming and power delivery section 222, generate at least three inductively coupled plasma loops (not shown) that converge in the plasma generation region 202 that forms a magnetically confined Z-pinch. The loops flow through the region between the inner core 232 and outer core 234 and through the plasma generation region 202.

In operation, the voltage pulse from the pulse generator 226 charges the capacitor 224. During the charging time, the small leak current from the cores 232, 234 sustains the plasma loop. The pinch operation requires a sustained loop, because it requires ionized gas for proper function. The outer core 234 saturates, driving the impedance to zero. The capacitor then discharges. This results in beneficial pulse compression. The inner core 232 couples the current pulse to the plasma loops, resulting in a large pulse in plasma current known as the Z-pinch.

The plasma generation region 202 produces and emits nearly 100% of the EUV radiation produced by the plasma. The plasma loops do not produce EUV light. The result is that the source 200 produces a high quality, relatively compact source of EUV light 236 from a well-defined and stable pinch plasma confinement region 238 within the plasma generation region 202. By using the pulse forming and power delivery section 222 to drive and contain the plasma, the source 200 operates without the use of electrodes that are commonly used to conduct discharge current to the plasma in known systems.

Known Z-pinch plasma chambers have electrical continuity between the high voltage region 204 and the plasma generation region 202. Consequently, when the outside of the chamber 210 is at a high potential voltage, it is difficult or impossible to have back-side access to the chamber.

In contrast, with the configuration shown in FIG. 2A, the high voltage region 204 is electrically connected to the high voltage side 228 of the pulse forming and power delivery section 222, while the grounded region 206 is coupled to the high voltage region 204. In particular, the grounded region 206 has an outer surface that is coupled to ground at a first location 240. Furthermore, there is an insulating vacuum pipe in the insulating region 208 which includes an insulating break 242. With this configuration, the insulating region 208 is grounded at position 244 after the insulating break 242 near an output 246 of the chamber 210. The result is that the insulating region 208 serves to provide an insulating break that reduces the negative potential that attracts ions to further downstream components in operation as desired.

A current preventing inductive core 248 is positioned at the boundary between the high voltage region 204 and the grounded region 206 of the chamber 210. The hard ground connected to positions 240, 244 in the ground region 206 and the ground connected to the ground side 230 are electrically connected. A bias electric current is applied to the current preventing inductive core 248. This bias electric current reduces the current flow from the high voltage region 204 into the grounded region 206.

In operation, some pulsed leak current flows along the pipe (118 or 240) proximate to the end of the chamber through inductive core 248. The time-change of the current on the pipe (118, 240) gives a time-change of magnetic flux flowing in a circumferential direction of the core 248. The time-change of the magnetic flux causes an inverse current to flow on the pipe (118 or 240) proximate to the end of the chamber. Consequently, the leak current is canceled by the resulting induced current thereby preventing the leak current from flowing further. As the voltage at the high voltage side 228 swings from negative to positive, the current preventing core 248 is then reset automatically.

Various embodiments can use different dimensions of elements in the chamber 210. In general, a width 250, $W_G$, of the grounded region is greater than a width 251, $W_{PG}$, of the plasma generation region 202. In some embodiments, the cross-section area perpendicular to magnetic flux in the current preventing core 248 of the current preventing inductive core 248 is larger than the inner core 232. In some embodiments, the cross-section area of the current preventing inductive core 248 is at least twice the cross-section area of the inner core 232. In this case, a width 252, $W_{HV}$, of the high voltage region is greater than the width 250, $W_G$, of the grounded region. In some configurations, a width 252, $W_{HV}$, of the high voltage region is at least twice the width 250, $W_G$, of the grounded region.

The input/output port 246, like the input/output port 126 described in connection with FIG. 1, can be configured for versatile connection of various downstream components to support custom and semi-custom configurations of the source 200 to address numerous different applications. The generated EUV radiation 236 can also be directed at the backside of the pinch confinement region 238 (back side EUV radiation not shown). The output 246 can be configured to collect this back-side EUV radiation and project it to downstream components. For example, the input/output port 246 can be configured to enhance the EUV radiation using a multilayer mirror at the output. The input/output port 246 can also be used for optical access and gas fueling purposes.

All or some of these configurations of the input/output port 246 can be combined as well. Some of these configurations are described in more detail below.

For example, in one particular embodiment, the source 200 is configured to produce about twenty Watts of 13.5-nm-wavelength EUV radiation in 2-pi steradians with a brightness of eight W/mm$^2$-sr. The source radiation can be pulse at relatively high, such as about 2.5 kHz, and the rate can be user configurable. The plasma confinement region 238 for such a source can be less than 1 mm in diameter, or even can be less than 0.5 mm in diameter. In some methods of operation, the actual position of the plasma confinement region 238 varies by less than a few microns pulse-to-pulse.

Figure 2B:
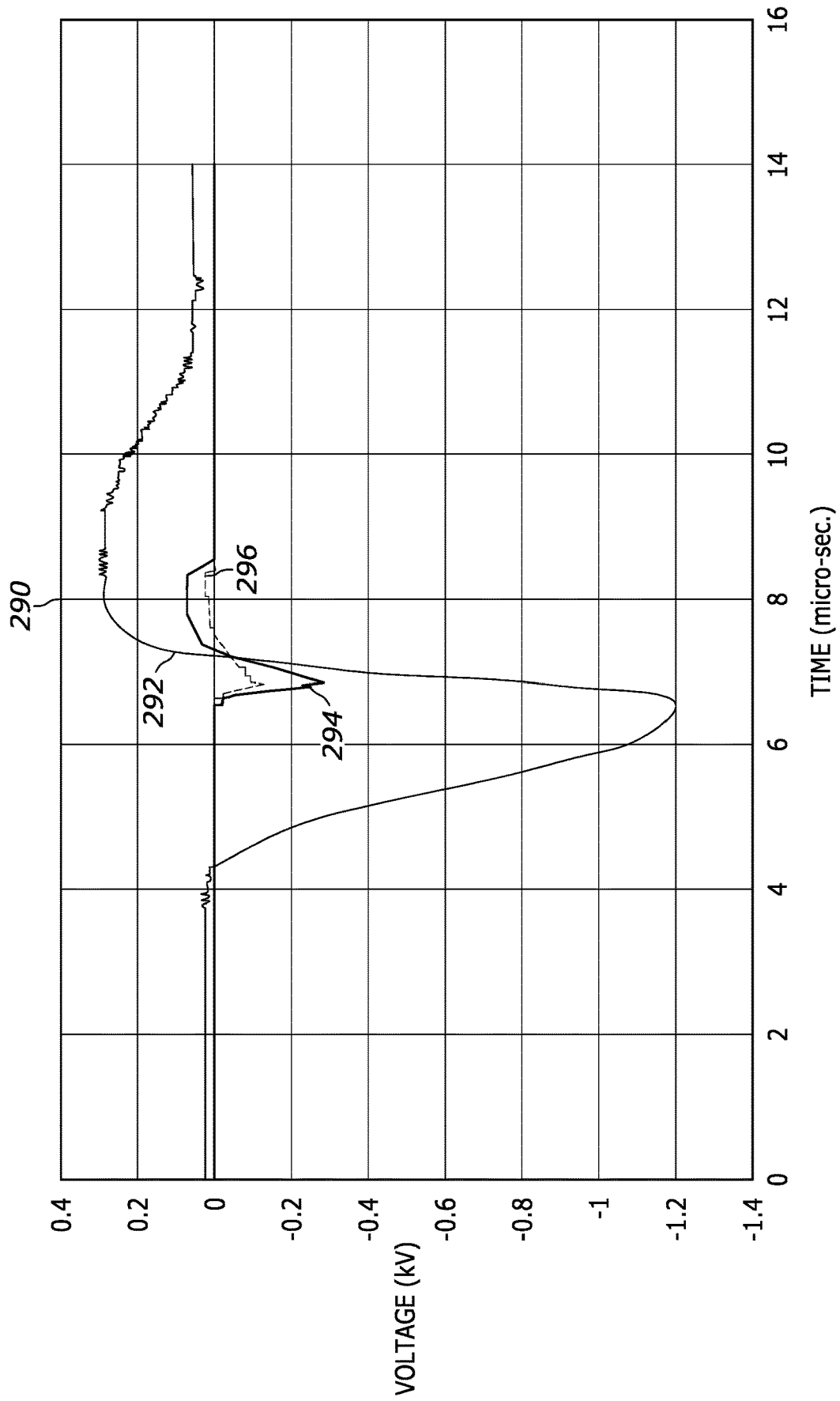
FIG. 2B illustrates graphs from an oscilloscope that show the pulse operation of an embodiment of an ultraviolet light source of the present teaching.

FIG. 2B illustrates graphs 290 from an oscilloscope that shows the pulse operation of an embodiment of an ultraviolet light source of the present teaching. The first trace 292 illustrates the capacitor discharge used to create the Z-pinch plasma. The second trace 294 illustrates the voltage measured at pipe position 240 (FIG. 2A) to ground. These voltages are both large, negative high-voltage swings of 500 V and greater. The third trace 296 is the voltage measured at pipe position 244 (FIG. 2A) to ground.

Thus, the configuration described in FIG. 2A reduced the leakage voltage at pipe position 244 down to relatively low voltage levels that are safe for the operator to maintain and reconfigure. The plasma current flows only when the voltage swings from low to high, so the main current pulse is always in the same direction. While the capacitor voltage does swing positive, the negative voltage is always larger, so the current preventing inductive core 248 is negatively charged after each pulse, and can be reset by a positive applied voltage.

Figure 3:
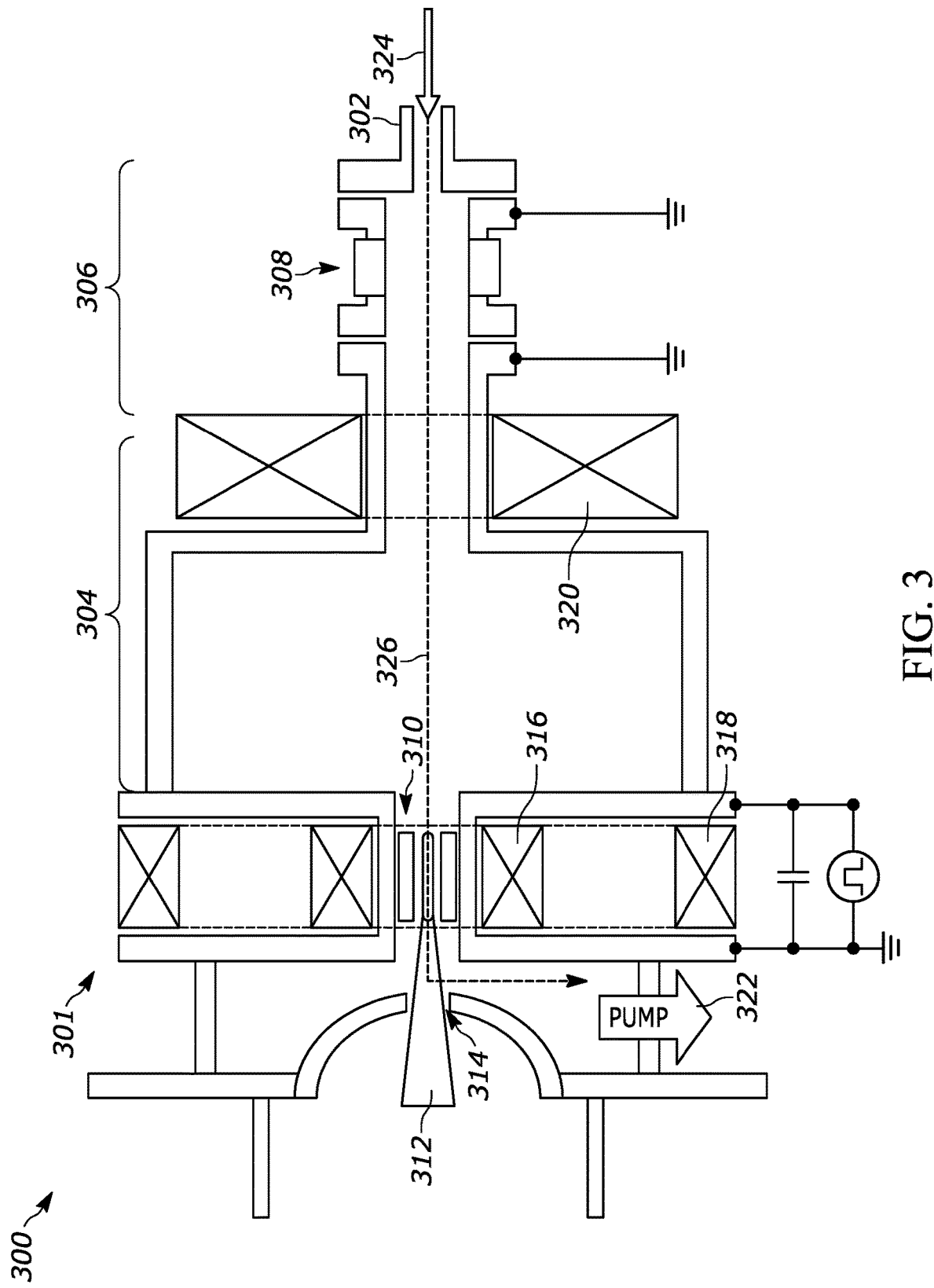
FIG. 3 illustrates an embodiment of an ultraviolet light source according to the present teaching that includes a gas feed port coupled to the insulating region.

FIG. 3 illustrates an embodiment of an ultraviolet light source 300 according to the present teaching that includes a gas feed port 302 coupled to the insulating region 308. Similar to the source 200 described in connection with FIG. 2A and the chamber 100 described in connection with FIG. 1, the source 300 includes many common components including a chamber 301, high voltage region 304, grounded region 306, insulating region 308, plasma confinement region 310, a port 314 for passing EUV radiation 312, an inner core 316, outer core 318, current preventing core 320, and pump 322.

A gas 324 is fed through the gas feed port 302 into the chamber 301 to the plasma confinement region. In some embodiments the gas 324 is Xenon gas. The gas 324 flows through the chamber 301 and out the pump 322 as illustrated by the dashed line 326. In some embodiments, the gas feed port 302 supports the insertion of a gas jet that delivers gas 324 to the plasma generation region. One advantage of attaching a gas feed port 302 to the insulating region 308 is that is such a configuration improves fueling of the plasma created in the plasma confinement region 310. This improvement can lead to higher plasma density which can result in a higher power and/or higher brightness of the EUV radiation 312. In some embodiments, the gas feed port 302 is the only gas port in the chamber 301. In some embodiments, more than one gas port is used.

Figure 4A:
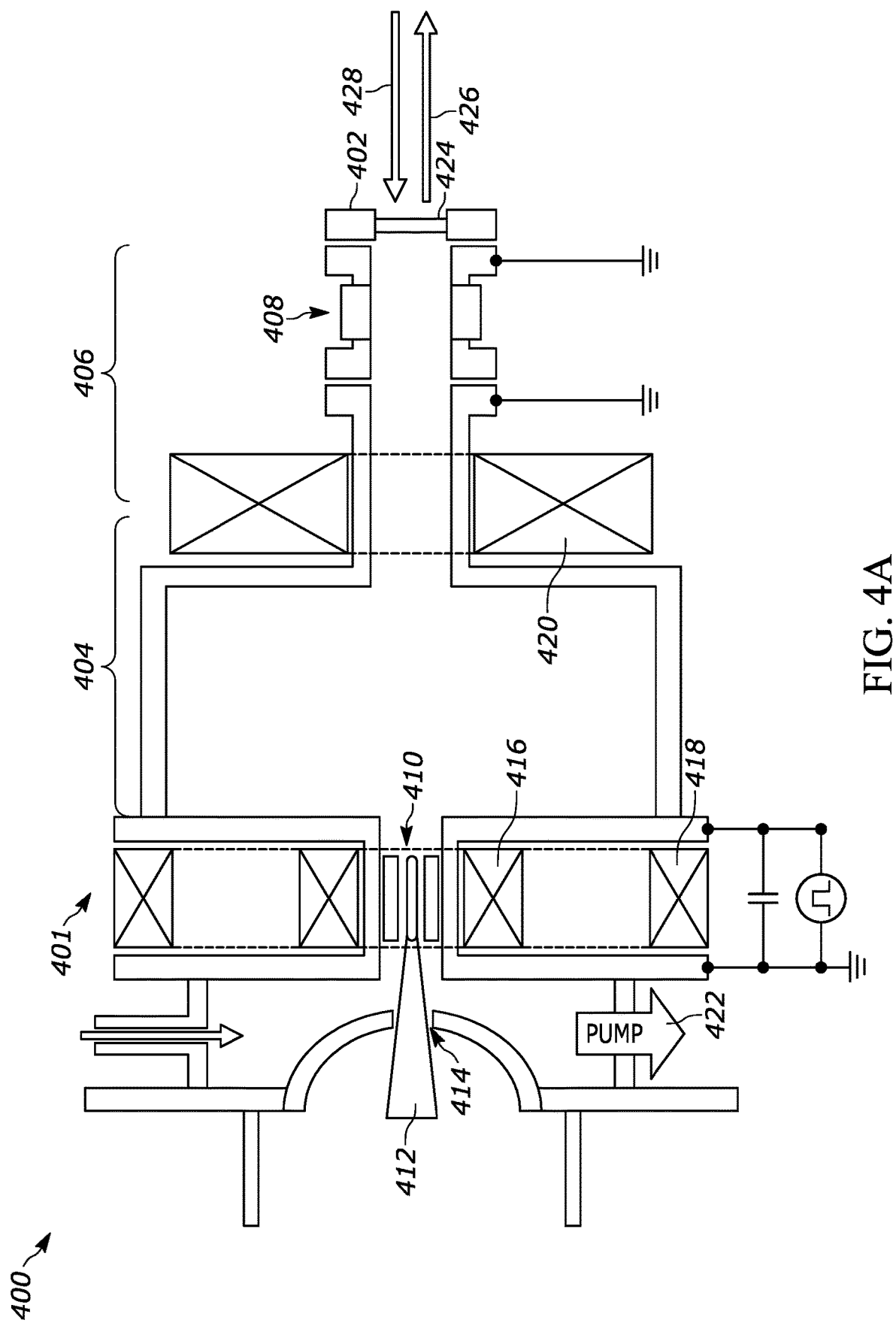
FIG. 4A illustrates an embodiment of an ultraviolet light source according to the present teaching that includes a diagnostic probe port coupled to the insulating region.

FIG. 4A illustrates an embodiment of an ultraviolet light source 400 according to the present teaching that includes a diagnostic probe port 402 coupled to the insulating region 408. Similar to the source 200 described in connection with FIG. 2A and the chamber 100 described in connection with FIG. 1, the source 400 includes many common components including a chamber 401, high voltage region 404, grounded region 406, insulating region 408, a plasma confinement region 410, a port 414 that passes EUV radiation 412, an inner core 416, outer core 418, current preventing core 420, and pump 422.

The diagnostic probe port 402 includes an optical port 424. The optical port 424 passes light 426 collected from the back-side of the plasma generation region 410. This light 426 can help detect plasma properties, including, for example, optical output power as a function of position and/or time. The port 424 can also pass probe light 428 into the chamber 401. The probe light 428 can be directed into the plasma confinement region and the resulting light 426 collected from the back-side of the plasma generation region 410 that returns to the port 424 can be detected to determine various plasma properties. The probe light 428 can also be used for numerous other purposes, such as to determine the properties of the gas. One feature of the chambers according to the present teaching is that it is highly desirable to have the optical port 424 at ground potential for safety reasons.

Figure 4B:
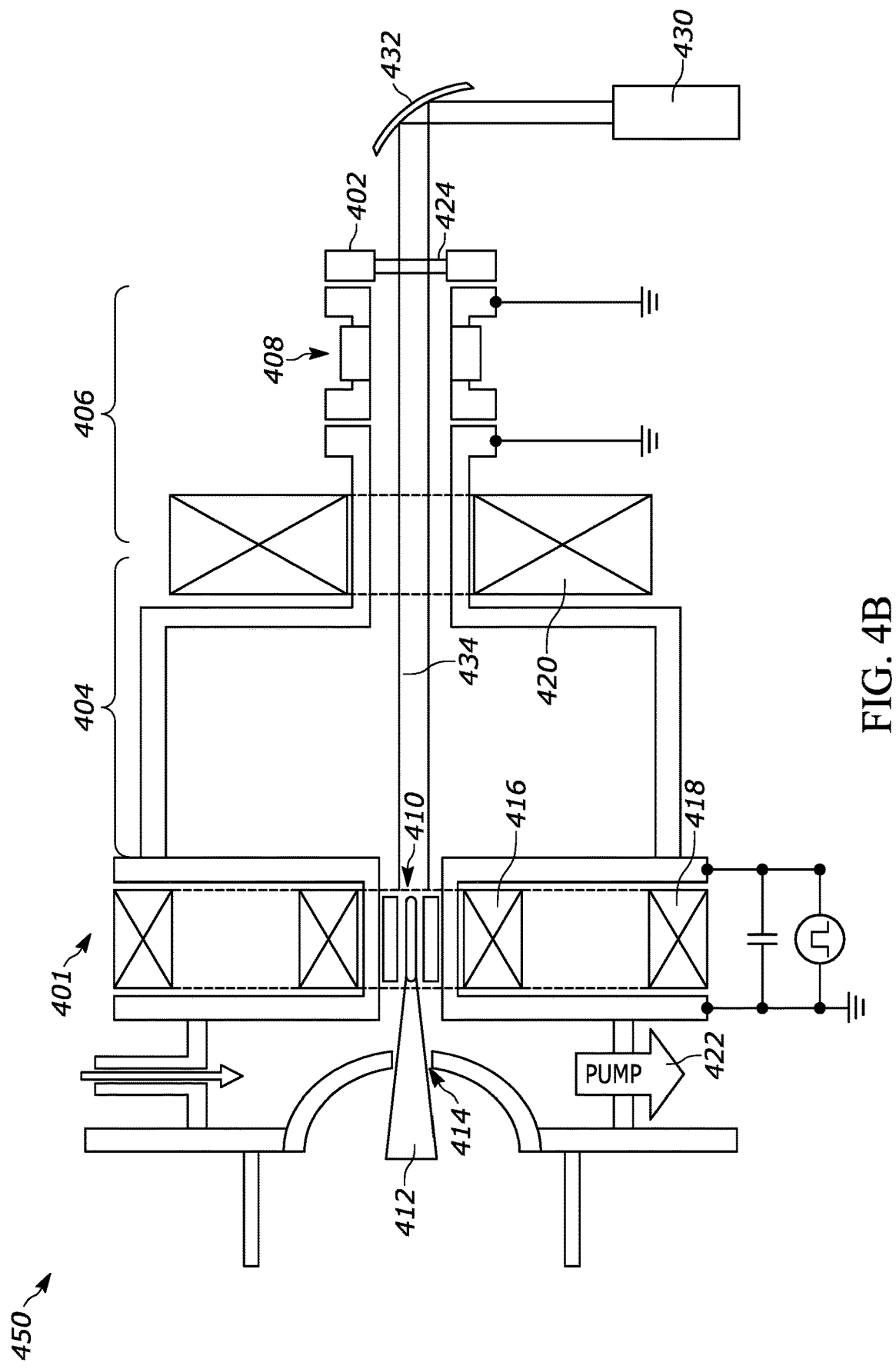
FIG. 4B illustrates another embodiment of an ultraviolet light source according to the present teaching that includes a laser source having an output that is optically coupled to the insulating region.

FIG. 4B illustrates another embodiment of an ultraviolet light source 450 according to the present teaching that includes a laser source 430 having an output optically coupled to the insulating region 408 so that light passes through the chamber into the plasma confinement region. Similar to the source 200 described in connection with FIG. 2A, the chamber 100 described in connection with FIG. 1, and the source 400 described in connection with FIG. 4A, the source 450 includes many common components, including the chamber 401, high voltage region 404, grounded region 406, insulating region 408, plasma confinement region 410, port 414 that passes EUV radiation 412, inner core 416, outer core 418, current preventing core 420, and the pump 422.

Like the configuration described in connection with FIG. 4A, the diagnostic probe port 402 includes an optical port 424 that passes radiation with a desired frequency. The optical port can include a filter to pass only the desired radiation. The optical port 424 in FIG. 4B is generally configured to pass laser radiation generated by the laser 430. Additionally, the optical port 402 can be used for diagnostic purposes to detect properties and/or to probe the plasma as described in connection with FIG. 4A.

Laser optics 423 are positioned relative to the output of the laser 430 to direct laser radiation generated by the laser 430 into the plasma confinement region. For example, the laser optics 432 can be a mirror or collection of mirrors as shown that directs laser radiation from the output of the laser 430 to the plasma confinement region. In other embodiments, the laser optics 430 can include a transmissive lens that passes and focuses the laser radiation into the plasma confinement region. In various embodiments, the laser 430 generates sufficient power at the desired wavelength that heats the plasma to form a Z-pinched plasma. As described in connection with the configuration of FIG. 4A, one feature of the chambers is that it includes the optical port 424 at ground potential for safety reasons.

Figure 5:
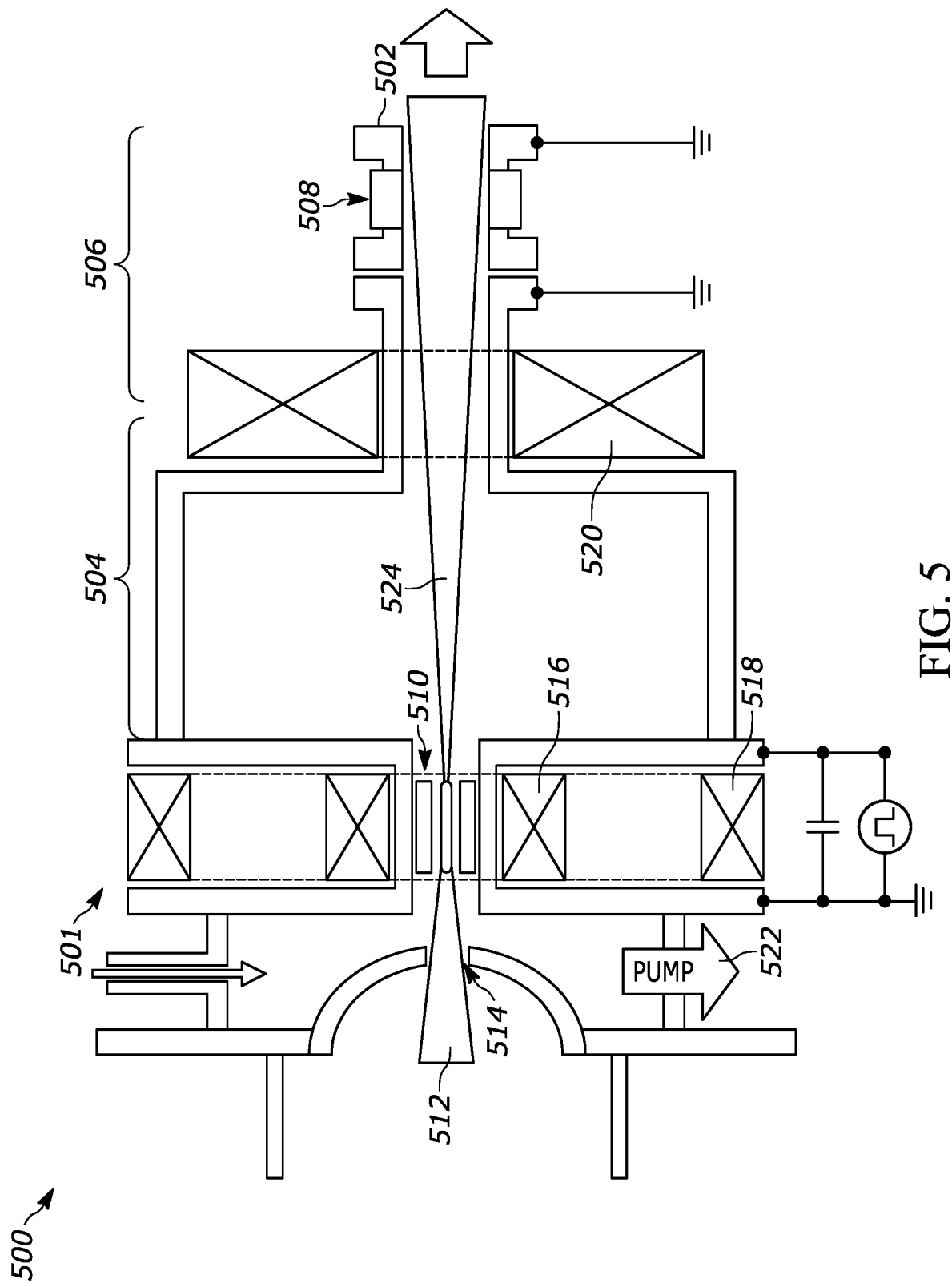
FIG. 5 illustrates an embodiment of an ultraviolet light source according to the present teaching that includes a port comprising a transparent region for passing generated ultraviolet light coupled to the insulating region.

FIG. 5 illustrates an embodiment of an ultraviolet light source 500 according to the present teaching that includes a port 502 having a transparent region for passing generated ultraviolet light coupled to the insulating region 508. Similar to the source 200 described in connection with FIG. 2A and the chamber 100 described in connection with FIG. 1, the source 500 includes many common components including a chamber 501, high voltage region 504, grounded region 506, insulating region 508, plasma confinement region 510, a port 514 for passing EUV radiation 512, an inner core 516, outer core 518, current preventing core 520, and pump 522.

The port 502 is configured to pass EUV radiation 524 generated in the plasma generation region 510 from the back-side. The port 502 is also configured to interface with a beamline assembly system, which can be a customer supplied system to the chamber 501. In some embodiments, the system can be a sealed system that interfaces with the port 520 so as to maintain a desired pressure in the chamber during operation. In other embodiments, a transparent port seals the port and light transmits through the port to the attached system. One feature of the source 500 is that EUV radiation emerges as both front-side EUV radiation 512 and back-side EUV radiation 524. This feature allows two systems to be supplied from the same source 500, one with front-side access and one with back-side access. In various embodiments, the two systems can be the same system or different systems.

Figure 6:
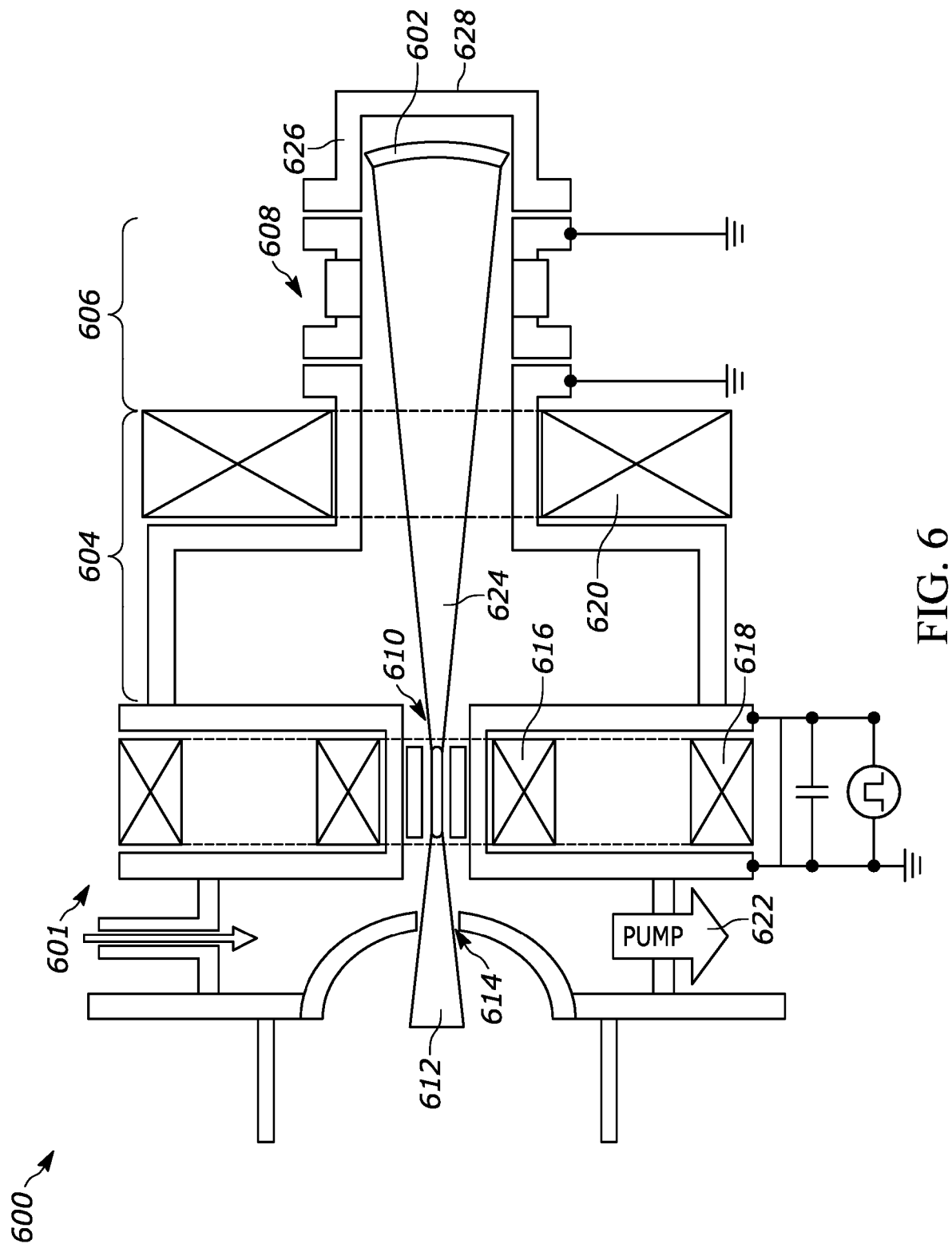
FIG. 6 illustrates an embodiment of an ultraviolet light source according to the present teaching that includes a mirror for reflecting generated ultraviolet light back into the plasma confinement region.

FIG. 6 illustrates an embodiment of an ultraviolet light source 600 according to the present teaching that includes a mirror 602 for reflecting generated ultraviolet light back into the plasma confinement region. Similar to the source 200 described in connection with FIG. 2A and the chamber 100 described in connection with FIG. 1, the source 600 includes many common components including a chamber 601, high voltage region 604, grounded region 606, insulating region 608, a plasma confinement region 610, a port 614 for passing EUV radiation 612, an inner core 616, outer core 618, current preventing core 620, and pump 622. The mirror 602 reflects at least some emitted EUV radiation 624 from the plasma generation region 610 back toward the front of the chamber to co-propagate with the EUV radiation 612 from the front side. In some configurations, the mirror 602 is formed in a parabolic shape or some other curved shape that focuses the reflected light back through the plasma generation region. The mirror 602 can be configured to be highly reflective for EUV radiation 624. In these configurations, the mirror 602 can provide a substantial improvement in the optical power available from the source 600 at the port 614. The improvement can be nearly a factor of two. In other configurations, the mirror 602 is a partially reflecting mirror.

The mirror 602 can be constructed in numerous ways, such as by using a multilayer construction of Molybdenum and Silicon. The mirror 602 can be held and/or positioned by a securing member 626 attached to the insulating region 608. The securing member 626 can include a port that is transparent to the EUV radiation 624.

One feature of the high-voltage chamber configuration for EUV sources according to the present teaching is that it allows for safe and flexible access to one end of a Z-pinch plasma source that emits radiation from the other end. Another feature of the chamber configurations according to the present teaching is that it supports the necessary high-voltage drive protocol and system components that are needed to generate and sustain a Z-pinch and the associated plasma loops using inductive coils to drive the plasma current.

It should be understood that EUV sources according to the present teaching can support a wide array of test and measurement capabilities that can be initially supplied with the source, or that can be added at a later point in the system life cycle. Another advantage of the EUV sources of the present teaching is that they can support highly flexible access to the EUV radiation generated by the plasma that results in many more possible configurations than known EUV systems. In addition, the EUV sources of the present teaching can provide more interaction with and control of the plasma using one or more optical excitation, optical probing, and feed gas management. Furthermore, the EUV sources of the present teaching can support more flexible EUV optical beam shaping and management by incorporating various types of optics within and/or near the back-side access area of the configuration.

One skilled in the art will appreciate that there are numerous methods of generating ultraviolet light according to the present teaching. These methods generally provide a feed gas to a plasma confinement region in a plasma chamber. Some methods also apply gas to a port positioned at one or more of various locations, such as adjacent to the insulating region. A high voltage is applied to a high voltage region connected to the plasma confinement region in the plasma chamber. A grounded region is electrically connected to the high voltage region. A train of voltage pulses is applied to at least one capacitor electrically connected across an outer magnetic core surrounding an inner magnetic core that is positioned around the plasma confinement region. The voltage pulses cause at least one capacitor to charge so that the outer magnetic core saturates resulting in the capacitor(s) discharging causing the inner core to couple current pulses into the plasma confinement region, thereby forming a plasma in a loop where the plasma is sustained between voltage pulses by a leakage current. The plasma generates ultraviolet light that propagates through a transparent port positioned adjacent to the plasma confinement region.

Numerous performance advantages are achieved by providing an insulating region that is grounded and coupled to the grounded region in order to reduce the attraction of ions generated in the plasma loop to the grounded region. An electric current is applied to an inductive core surrounding a portion of the grounded region of the plasma chamber in order to reduce current flow into the grounded region.

In addition, some methods include retro-reflecting a portion of the generated ultraviolet light entering the grounded region back to the plasma generation region to increase the brightness of ultraviolet light passing through the transparent port positioned adjacent to the plasma confinement region. Also, some methods include passing a portion of the generated ultraviolet light entering the grounded region through a transparent port positioned adjacent to the insulating region. Also, some methods include characterizing the generated ultraviolet light passed through the transparent port positioned adjacent to the insulating region. Some methods also pass a diagnostic probe beam through a transparent port positioned adjacent to the insulating region into the plasma generation region. Some methods measure the properties of the plasma in response to the interaction of the diagnostic probe beam and the plasma.

Equivalents

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:
1. A plasma chamber comprising:
   a) a plasma generation region that defines a plasma confinement region;
   b) a port positioned adjacent to a first side of the plasma generation region that allows generated light to pass out of the chamber;

c) a high voltage region coupled to the plasma generation region;
d) a grounded region coupled to the high voltage region, the grounded region defining an outer surface configured to be coupled to ground; and
e) a current preventing inductive core surrounding a portion of the grounded region and positioned at a boundary between the high voltage region and the grounded region.

2. The plasma chamber of claim 1, wherein a width of the high voltage region is greater than a width of the grounded region.

3. The plasma chamber of claim 1, wherein the width of the high voltage region is at least two times greater than the width of the grounded region.

4. The plasma chamber of claim 1, wherein a width of the plasma generation region is less than a width of the grounded region.

5. The plasma chamber of claim 1, further comprising an insulated region having a first end that is coupled to the grounded region and a second end that is configured to be coupled to ground potential.

6. The plasma chamber of claim 5, wherein the second end of the insulated region comprises a port.

7. The plasma chamber of claim 6, further comprising a gas feed port positioned in the port at the second end of the insulated region, the gas feed port providing gas to the plasma generation region.

8. The plasma chamber of claim 6, wherein the port at the second end of the insulated region comprises a plasma diagnostic port.

9. The plasma chamber of claim 6, wherein the port at the second end of the insulated region comprises an aperture for passing light.

10. The plasma chamber of claim 1, further comprising a mirror positioned adjacent to the grounded region that is oriented to reflect at least some light generated in the plasma generation region back to the plasma generation region.

11. The plasma chamber of claim 10, wherein the mirror is partially transmitting so that some light generated in the plasma passes through the port at the second end of the insulated region.

12. The plasma chamber of claim 1, further comprising a gas feed port positioned proximate to the plasma generation region.

13. The plasma chamber of claim 1, further comprising a vacuum pump port positioned proximate to the plasma generation region.

14. A light source comprising:
a) a plasma chamber comprising:
  i) a plasma generation region that defines a plasma confinement region;
  ii) a port positioned adjacent to a first end of the plasma generation region that allows generated light to pass out of the chamber;
  iii) a high voltage region coupled to a second end of the plasma generation region; and
  iv) a grounded region coupled to the high voltage region;
b) an insulated region having a first end that is coupled to the grounded region and a second end that is configured to be coupled to ground potential, the insulated region reducing negative potential proximate to the grounded region to reduce attraction of ions generated in the plasma generation region;
c) an inner inductive core positioned around the plasma generation region that couples current into a plasma loop;
d) an outer inductive core positioned around the inner inductive core; and
e) an inductive core positioned around a portion of the grounded region and configured to prevent current flow in the grounded region.

15. The light source of claim 14 Previously Presented wherein a width of the high voltage region is greater than a width of the grounded region.

16. The light source of claim 14, wherein a width of the high voltage region is at least two times greater than the width of the grounded region.

17. The light source of claim 14, wherein a width of the plasma generation region is less than a width of the grounded region.

18. The light source of claim 14, wherein the second end of the insulated region comprises a port.

19. The light source of claim 18, further comprising a gas feed port positioned in the port at the second end of the insulated region, the gas feed port providing gas to the plasma generation region.

20. The light source of claim 18, wherein the port at the second end of the insulated region comprises a plasma diagnostic port.

21. The light source of claim 18, wherein the port at the second end of the insulated region comprises an aperture for passing light.

22. The light source of claim 14, further comprising a mirror positioned adjacent to the grounded region that is oriented to reflect at least some light generated in the plasma generation region back to the plasma generation region.

23. The light source of claim 22, wherein the mirror is partially transmitting so that some light generated in the plasma passes through the port.

24. The light source of claim 14, further comprising a gas feed port positioned proximate to the plasma generation region.

25. The light source of claim 14, further comprising a vacuum pump port positioned proximate to the plasma generation region.

26. A method of generating light, the method comprising:
a) providing feed gas to a plasma confinement region in a plasma chamber;
b) applying a high voltage pulse to a high voltage region connected to the plasma confinement region in the plasma chamber;
c) grounding a grounded region electrically connected to the high voltage region;
d) applying a train of voltage pulses to at least one capacitor electrically connected across an outer magnetic core surrounding an inner magnetic core that is positioned around the plasma confinement region, the voltage pulses causing at least one capacitor to charge so that the outer magnetic core saturates resulting in the at least one capacitor discharging causing the inner core to couple current pulses into the plasma confinement region, thereby forming a plasma in a loop where the plasma is sustained between voltage pulses by a leakage current, the plasma generating light that propagates through a transparent port positioned adjacent to the plasma confinement region;
e) grounding an insulting region that is coupled to the grounded region, thereby reducing attraction of ions generated in the plasma loop to the grounded region; and f) applying an electric current to an inductive core surrounding a portion of the grounded region of the plasma chamber, thereby reducing current flow into the grounded region.

27. The method of claim 26, further comprising retro-reflecting a portion of the generated light entering the grounded region back to the plasma generation region to increase brightness of light passing through the transparent port positioned adjacent to the plasma confinement region.

28. The method of claim 26, further comprising passing a portion of the generated light entering the grounded region through a transparent port positioned adjacent to the insulating region.

29. The method of claim 28, further comprising characterizing the generated light passed through the transparent port positioned adjacent to the insulating region.

30. The method of claim 26, further comprising passing a diagnostic probe beam through a transparent port positioned adjacent to the insulating region into the plasma generation region.

31. The method of claim 30, further comprising measuring properties of the plasma in response to the interaction of the diagnostic probe beam and the plasma.

32. The method of claim 26, further comprising applying gas to a port positioned adjacent to the insulating region.

* * * * *